US012574042B2

(12) United States Patent
Sanyal

(10) Patent No.: US 12,574,042 B2
(45) Date of Patent: Mar. 10, 2026

(54) ANALOG-TO-DIGITAL CONVERTER (ADC) ARCHITECTURES FOR HIGH RESOLUTION AND ENERGY EFFICIENCY

(71) Applicant: ARIZONA BOARD OF REGENTS ON BEHALF OF ARIZONA STATE UNIVERSITY, Scottsdale, AZ (US)

(72) Inventor: Arindam Sanyal, Scottsdale, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 160 days.

(21) Appl. No.: 18/490,931

(22) Filed: Oct. 20, 2023

(65) Prior Publication Data

US 2024/0137040 A1 Apr. 25, 2024
US 2024/0235572 A9 Jul. 11, 2024

Related U.S. Application Data

(60) Provisional application No. 63/380,449, filed on Oct. 21, 2022.

(51) Int. Cl.
*H03M 1/10* (2006.01)
*H03M 1/06* (2006.01)
(Continued)

(52) U.S. Cl.
CPC ......... *H03M 1/462* (2013.01); *H03M 1/0668* (2013.01); *H03M 1/201* (2013.01)

(58) Field of Classification Search
CPC .. H03M 1/1245; H03M 1/1033; H03M 1/164; H03M 1/60; H03M 1/0629; H03M 1/0854; H03M 1/167; H03M 1/0626; H03M 1/0639; H03M 1/066; H03M 1/069; H03M 1/1038; H03M 1/1042; H03M 1/1047; H03M 1/1057; H03M 1/1071; H03M 1/12; H03M 1/1215; H03M 1/162; H03M 1/201; H03M 1/38; H03M 1/46; H03M 1/466; H03M 1/468; H03M 1/508; H03M 1/68; H03M 1/74; H03M 3/378; H03M 3/396;
(Continued)

(56) References Cited

U.S. PATENT DOCUMENTS 8,400,341 B2 * 3/2013 Su .................... H03M 1/1265
341/157
9,136,865 B2 * 9/2015 Kinyua ................ H03H 11/04
(Continued)

OTHER PUBLICATIONS

Yoo et al. "An 8-Channel Scalable EEG Acquisition SoC With Patient-Specific Seizure Classification and Recording Processor," IEEE Journal of Solid-State Circuits, vol. 48, No. 1, Jan. 2013, 15 pages.
(Continued)

*Primary Examiner* — Linh V Nguyen
(74) *Attorney, Agent, or Firm* — MH2 Technology Law Group LLP

(57) ABSTRACT

A low-pass and band-pass delta-sigma (ΔΣ) analog-to-digital converter (ADC) device for sensor interface is disclosed. The device includes a first stage comprising a low-resolution passive integrator-based noise-shaping successive approximation register (SAR) ADC and a second stage comprising a voltage-controlled oscillator (VCO)-ADC.

19 Claims, 20 Drawing Sheets

(51) Int. Cl.
    *H03M 1/20*        (2006.01)
    *H03M 1/46*        (2006.01)

(58) Field of Classification Search
    CPC ...... H03M 3/402; H03M 3/414; H03M 3/422;
             H03M 3/424; H03M 3/43; H03M 3/464;
                                H03M 9/00
    USPC ........ 341/143, 155, 161, 162, 172, 118, 120
    See application file for complete search history.

(56) References Cited

U.S. PATENT DOCUMENTS

| | | | | |
|---|---|---|---|---|
| 9,397,692 | B1 * | 7/2016 | Zanbaghi | H03M 3/438 |
| 9,455,737 | B1 * | 9/2016 | Rajaee | H03M 3/464 |
| 9,503,112 | B1 * | 11/2016 | Zanbaghi | H03M 1/0602 |
| 10,931,299 | B1 * | 2/2021 | Kinyua | H03M 3/412 |
| 11,424,724 | B2 * | 8/2022 | Kinyua | H03F 3/2175 |
| 2013/0120170 | A1 * | 5/2013 | Gupta | H03M 1/164 |
| | | | | 341/110 |
| 2015/0038870 | A1 * | 2/2015 | Yoo | H03H 17/0248 |
| | | | | 330/9 |
| 2017/0170840 | A1 * | 6/2017 | Zhao | H03M 1/1071 |
| 2020/0076448 | A1 * | 3/2020 | Mitteregger | H03M 3/464 |
| 2020/0373934 | A1 * | 11/2020 | Shibata | H03M 1/1245 |
| 2022/0327370 | A1 * | 10/2022 | Huynh | H03M 3/458 |
| 2022/0404852 | A1 * | 12/2022 | Jung | G11C 5/147 |
| 2023/0179211 | A1 * | 6/2023 | Huang | H03M 1/066 |
| | | | | 341/118 |
| 2023/0179214 | A1 * | 6/2023 | Kinyua | H03M 1/0854 |
| | | | | 341/118 |
| 2024/0413835 | A1 * | 12/2024 | Chen | H03M 1/0629 |

OTHER PUBLICATIONS

Lee et al. "A 0.0375mm$^2$ 203.5 μW 108.8dB DR DT Single-Loop DSM Audio ADC Using a Single-Ended Ring-Amplifier-Based Integrator in 180nm CMOS," 2022 IEEE International Solid-State Circuits Conference, 2022, 3 pages.

Huang et al. "28.1 A Distortion-Free VCO-Based Sensor-to-Digital Front-End Achieving 178.9dB FoM and 128dB SFDR with a Calibration-Free Differential Pulse-Code Modulation Technique," 2021 IEEE International Solid-State Circuits Conference, 2021, 3 pages.

Bhanushali et al. "A 13.2fJ/step 74.3-dB SNDR Pipelined Noise-shaping SAR+VCO ADC," School of Electrical, Computer and Energy Engineering, Arizona State University, IEEE 2023, 4 pages.

Chandrasekaran et al. "OTA-Free 1-1 MASH ADC Using Fully Passive Noise-Shaping SAR & VCO ADC," IEEE Journal of Solid-State Circuits, 2021, 12 pages.

Chandrasekaran et al. "OTA-free 1-1 MASH ADC using Fully Passive Noise Shaping SAR & VCO ADC," 2021 Symposium on VLSI Circuits Digest of Technical Papers, 2021, 2 pages.

Chandrasekaran et al. "21 fJ/step OTA-Less, Mismatch-Tolerant Continuous-Time VCO-Based Band-Pass ADC," IEEE Solid-State Circuits Letters, vol. 3, 2020, 4 pages.

Jayaraj et al. "8.6fJ/step VCO-Based CT 2nd-Order ΔΣ ADC," IEEE Asian Solid-State Circuits Conference, Nov. 4-6, 2019, 4 pages.

Sanyal, Arindam, "An Energy-Efficient Hybrid SAR-VCO ΔΣ Capacitance-to-Digital Converter in 40-nm CMOS," IEEE Journal of Solid-State Circuits, vol. 52, No. 7, Jul. 2017, 11 pages.

Sanyal et al. "A Hybrid SAR-VCO ΔΣ ADC with First-Order Noise Shaping," IEEE, 2014, 4 pages.

Sanyal et al. "A 18.5-fJ/step VCO-Based 0-1 MASH ΔΣ ADC with Digital Background Calibration," 2016 Symposium on VLSI Circuits Digest of Technical Papers, IEEE, 2016, 2 pages.

Jeong et al., A 600mVpp-Input-Range 94.5dB-SNDR NS-SAR-Nested DSM with 4th-Order Truncation-Error Shaping and Input-Impedance Boosting for Biosignal Acquisition, 2022 IEEE Symposium on VLSI Technology and Circuits Digest of Technical Papers, pp. 52-53.

Li et al., An 80dB-SNDR 98dB-SFDR Noise-Shaping SAR ADC with Duty-Cycled Amplifier and Digital-Predicted Mismatch Error Shaping, 2021 IEEE 47th European Solid State Circuits Conference, pp. 387-390.

Li et al., A First-Order Continuous-Time Noise-Shaping SAR ADC with Duty-Cycled Integrator, 2022 IEEE Symposium on VLSI Technology and Circuits Digest of Technical Papers, pp. 58-59.

Liu et al., A 40kHz-BW 90dB-SNDR Noise-Shaping SAR with 4x Passive Gain and 2nd-Order Mismatch Error Shaping, 2020 IEEE International Solid-State Circuits Conference, Feb. 18, 2020, pp. 158-160.

Liu et al., A 250kHz-BW 93dB-SNDR 4th-Order Noise-Shaping SAR Using Capacitor Stacking and Dynamic Buffering, 2021 IEEE International Solid-State Circuits Conference, Session 27, Discrete-Time ADCs, 27.1, pp. 370-372.

Tang et al., A 13.5-ENOB, 107-μW Noise-Shaping SAR ADC With PVT-Robust Closed-Loop Dynamic Amplifier, IEEE Journal of Solid-State Circuits, vol. 55, No. 12, Dec. 2020, pp. 3248-3259.

Wang et al., An 84dB-SNDR Low-OSR 4th-Order Noise-Shaping SAR with an FIA-Assisted EF-CRFF Structure and Noise-Mitigated Push-Pull Buffer-in-Loop Technique, ISSCC 2022, Session 25, Noise-Shaping ADCs, 25.6, pp. 418-420.

Chandrasekaran et al., OTA-Free 1-1 MASH ADC Using Fully Passive Noise-Shaping SAR & VCO ADC, IEEE Journal of Solid-State Circuits, vol. 57, No. 4, Apr. 2022, pp. 1100-1111.

* cited by examiner $d_{sar} = V_{in} + (1-kz^{-1})(Q_1 + \eta_{comp}) + \eta_{kT/c}$ $d_{sar} = V_{in} + V_{res} + \eta_{kT/c}$ $d_{VCO} = STF.V_{res} + NTF.Q_2 + \eta_{th}$ $d_{out} = d_{sar} - H(z)d_{vco}$

Example of inter-stage gain error shaping with 1st-order VCO

$d_{sar} = V_{in} + (1-kz^{-1})(Q_1 + \eta_{comp}) + \eta_{kT/c}$ $d_{vco} = (1+\Delta G)V_{res} + (1-z^{-1})Q_2 + \eta_{th}$ $d_{out} = d_{sar} - d_{vco} = V_{in} - \Delta G((1-kz^{-1})(Q_1 + \eta_{comp}) + \eta_{kT/c} + (1-z^{-1})Q_2 + \eta_{th}$ high-pass shaping of gain error

1.08mm 1.08mm 0.25mm 0.31mm

SAR

VCO

Calibration counters

800

| | This work | JSSC' 2021 [5] | ISSCC' 2020 [1] | ISSCC' 2021 [2] | VLSI' 2022 [6] | VLSI' 2022 [7] | ESSCIRC' 2021 [8] |
|---|---|---|---|---|---|---|---|
| Process | 65nm | 65nm | 40nm | 40nm | 65nm | 65nm | 65nm |
| Area (mm$^2$) | 0.08 | 0.04 | 0.06 | 0.09 | 0.13 | 0.03 | 0.04 |
| Fs (MHz) | 19 | 24 | 2 | 5 | 0.2 | 2 | 1 |
| Supply (V) | 1.2/0.95 | 1.1/1 | 1.1 | 1.1 | 1 | 1 | 1.2 |
| SAR resolution | 5b | 5b | 14b | 13b | 7b | 12b | 10b |
| Sampling cap | 1.1pF | 1.1pF | 36pF | 16pF | --- | 4pF | 2pF |
| $\Delta\Sigma$-order | 2 | 2 | 1 | 4 | 3 | 2 | 2 |
| PVT-robust | Yes | No | Yes | Yes | --- | No | No |
| Power (μW) | 120 | 160 | 67.4 | 340 | 5.2 | 13.5 | 7.3 |
| BW (kHz) | 1040    235 | 1100 | 40 | 250 | 10 | 62.5 | 31.25 |
| OSR | 9    40 | 11 | 25 | 10 | 10 | 16 | 16 |
| SNDR (dB) | 74.3    82.3 | 71.5 | 90.5 | 93.3 | 80.7 | 77.3 | 80 |
| FoM$_W$(fJ/sep) | 13.2    23.2 | 23.3 | 29.7 | 18.1 | 28.5 | 18 | 14.3 |
| FoM$_S$(dB) | 173.7    175.2 | 169.9 | 178.2 | 182 | 173.5 | 174 | 176.3 |

FIG. 9

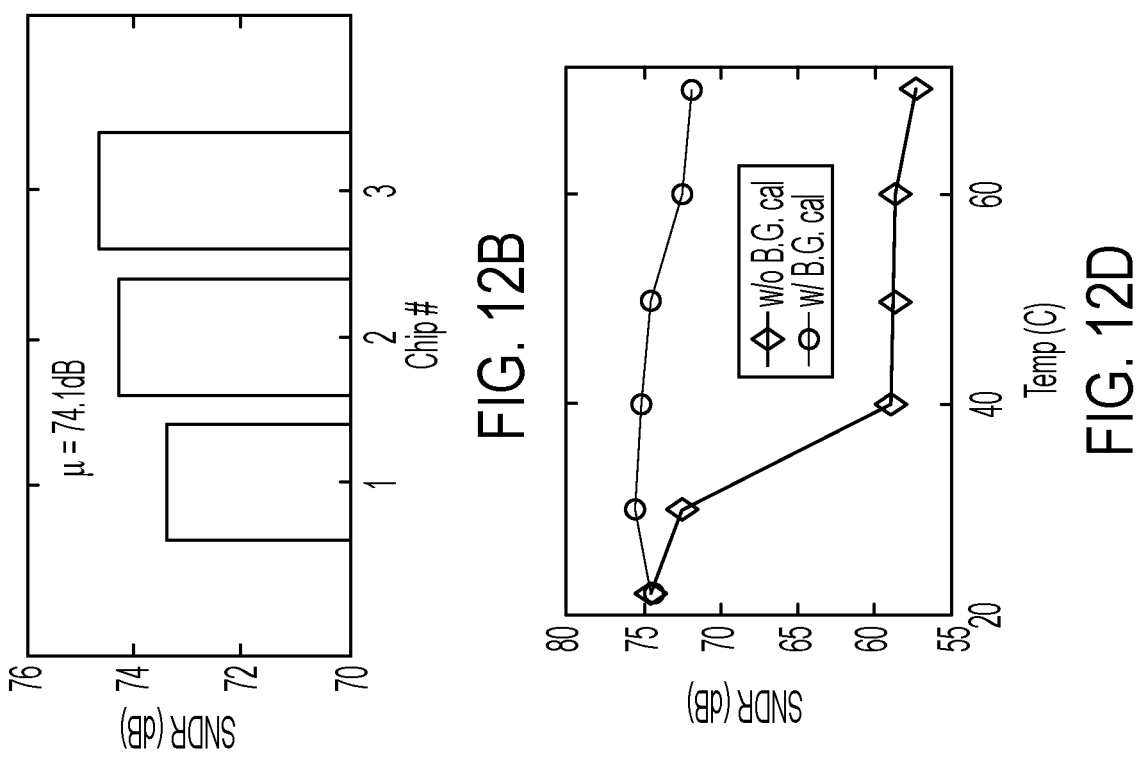
FIG. 12B
FIG. 12D
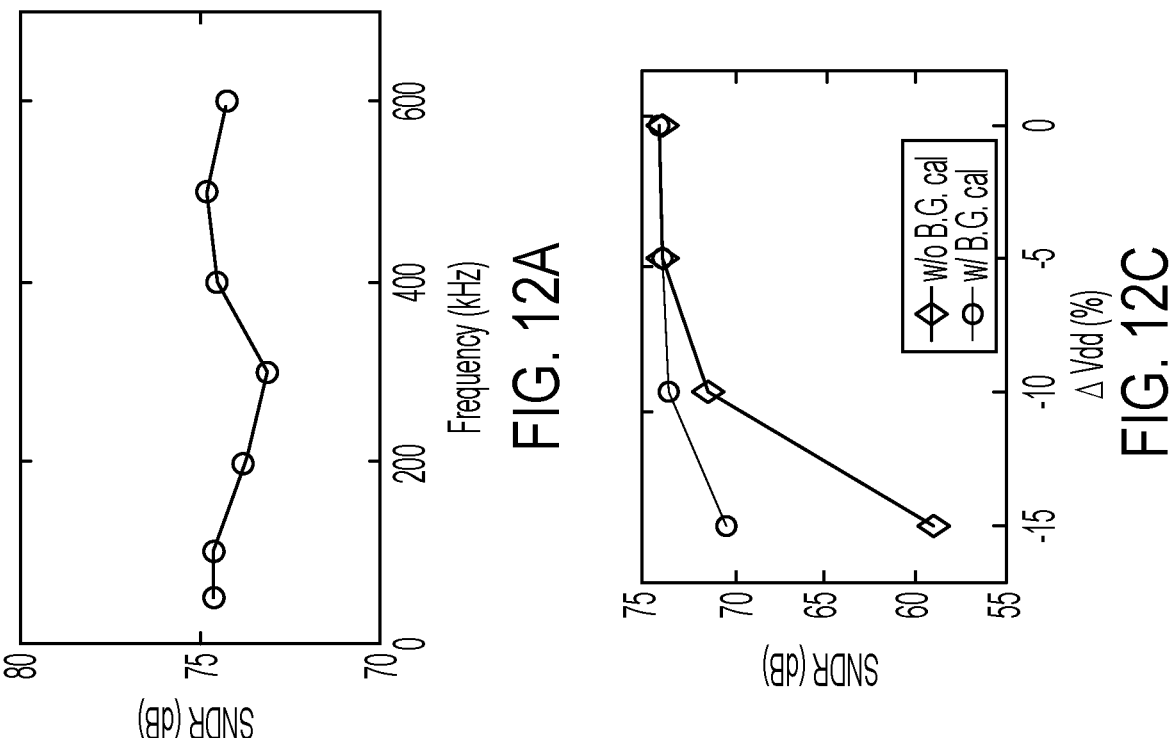
FIG. 12A
FIG. 12C 12-bit/1MHz, 1-1 MASH
NS-SAR+VCO ADC
[JSSC'21/VLSI'21]

12-bit/3MHz, 0-1 MASH
SAR+VCO ADC [VLSI'16]

12-bit/2MHz, 0-1 MASH
SAR+VCO ADC [CICC'14]

ANALOG-TO-DIGITAL CONVERTER (ADC) ARCHITECTURES FOR HIGH RESOLUTION AND ENERGY EFFICIENCY

CROSS-REFERENCE TO RELATED APPLICATIONS

This application claims the benefit of U.S. Provisional Application No. 63/380,449 filed Oct. 21, 2022, the contents of which are hereby incorporated by reference in its entirety.

FIELD OF THE DISCLOSURE

The present disclosure relates to analog-to-digital (ADC) architectures for high resolution and energy efficiency.

BACKGROUND

Analog-to-digital converters (ADCs) act as gatekeepers between physical world (analog) and data analytics (digital). In the internet-of-things (IoT) era of connected edge devices sensing various physical quantities for analysis in the cloud, ADCs need to have both high resolution (14-16 bits) and high energy efficiency at µW level power. High resolution data conversion for sensor interfaces is usually performed through delta-sigma ($\Delta\Sigma$) ADCs, while high energy efficiency data conversion can be achieved using time-domain circuits that uses mostly digital circuits in the signal processing chain and can leverage the advantages of complementary metal-oxide semiconductor (CMOS) technology scaling. Recent $\Delta\Sigma$ ADC-first sensor front-end uses high dynamic range (>96 dB) ring voltage-controlled oscillators (VCO) for digitization since VCO-ADCs are highly digital and have been demonstrated to have high energy efficiency. However, the limitations of VCO-ADCs for sensor front-end are limited linearity, which necessitates relatively high supply voltages (>1V) to handle artifacts in sensor data and cannot handle time varying input common-mode, which is common in many sensor applications. Time varying input common-mode can easily saturate the VCO integrators, and alias VCO pulse width modulated (PWM) tones into the signal band without additional front-end analog circuits (such as dc-servo loop circuits) that require large area passives and high-gain operational amplifiers which are challenging to design with high energy efficiency in scaled CMOS processes. Ring-amplifier based $\Delta\Sigma$ ADCs also show excellent energy efficiency and scalability with process and are a strong competitor to VCO-ADCs for IoT. However, ring-amplifiers need careful stabilization across process-voltage-temperature (PVT), and both ring-amplifier and VCO $\Delta\Sigma$ ADCs can only handle small signal swing.

SUMMARY

Generally speaking, an operational transconductance amplifier (OTA)-free pipelined passive noise-shaping (NS) successive approximation register (SAR) (NS-SAR)+VCO ADC is described that offers high resolution (>12-bit) with only a 5-bit NS-SAR stage and 4-36× lower sampling capacitor compared to state-of-the-art NS-SARs with similar effective number of bits (ENOB). Pipelining the NS-SAR and VCO stage linearizes VCO by reducing its input swing, increases the VCO integration time and its energy efficiency, and improves SFDR of ADC by suppressing frequency dependency of interstage gain. A calibration technique is disclosed to extract interstage gain and track VCO gain accurately in the background. Fabricated in 65 nm CMOS, the prototype ADC achieves the best Walden figure-of-merit (FoM) among state-of-the-art passive NS-SAR ADCs in similar technology and consumes 0.12 mW with signal-to-noise-and-distortion ratio (SNDR)/spurious free dynamic range (SFDR) of 74.3/89.1 dB at 13.2 fJ/step for OSR of 9.

The technology relates to analog-to-digital converter (ADC) architectures for high resolution (>14 bits) and energy efficiency (<5 fJ/conversion). ADCs interfaced with IoT-based sensors receive differential and time varying analog inputs that need to be converted to digital data. Simulation testing of hybrid ADC architectures combines voltage-controlled oscillators (VCOs) and successive approximation register (SAR) type ADCs. The hybrid architecture combination provides large signal handling capability, a highly digital nature, linearization of the VCO stage, and improved common-mode rejection. The architectures are also robust against process, voltage, and temperature (PVT variations). VCO center frequency tracking will be utilized to correct for large changes in PVT and stabilize the ADC performance. The present hybrid ADC structure combines elements of VCO and SAR ADCs and tracking can be implemented to monitor and correct for changes in PVT variations.

According to examples of the present disclosure, PVT-robust ADC architectures are disclosed for achieving resolution>14 bits at energy efficiency<5 fJ/conversion for bandwidths in the range of 100 k-500 kHz. A hybrid voltage-time domain ADC architecture is used to achieve both high resolution and low energy efficiency. SAR is a good candidate for voltage domain ADC with medium resolution and high energy efficiency, while ring VCO-based ADC is the most widely used architecture for time domain quantization. The combination of SAR and VCO brings several merits: highly digital nature, large signal handling capability, linearization of VCO stage and improved common-mode rejection. In this disclosure, techniques for calibration-free high-resolution $\Delta\Sigma$ ADC through high-pass shaping of interstage gain error are disclosed, as well as an analog front-end for improved common-mode rejection and mismatch/offset suppression.

In some examples, the disclosed sensor interface and radio can be different applications and have different requirements from the ADC. The sensor interface uses a high resolution (~14-bit) ADC that can operate from low supply voltage, such as 0.5V. The radio operates at high speed, 11-bit ADC resolution is sufficient and also the supply voltages can be high, such as 1V or 1.2V.

BRIEF DESCRIPTION OF THE FIGURES

The accompanying drawing figures incorporated in and forming a part of this specification illustrate several aspects of the disclosure, and together with the description serve to explain the principles of the disclosure.

FIG. 9 shows a table comparing examples of the present disclosure with other NS-SAR ADCs according to examples of the present disclosure.

FIG. 12A, FIG. 12B, FIG. 12C and FIG. 12D show plots of test-chip characterization according to examples of the present disclosure, where FIG. 12A shows a plot of SNDR vs. input frequency, FIG. 12B shows a plot of SNDR for multiple test-chips, FIG. 12C shows a plot of SNDR vs supply voltage, and FIG. 12D shows a plot of SNDR vs. temperature.

DETAILED DESCRIPTION

Figure 1:
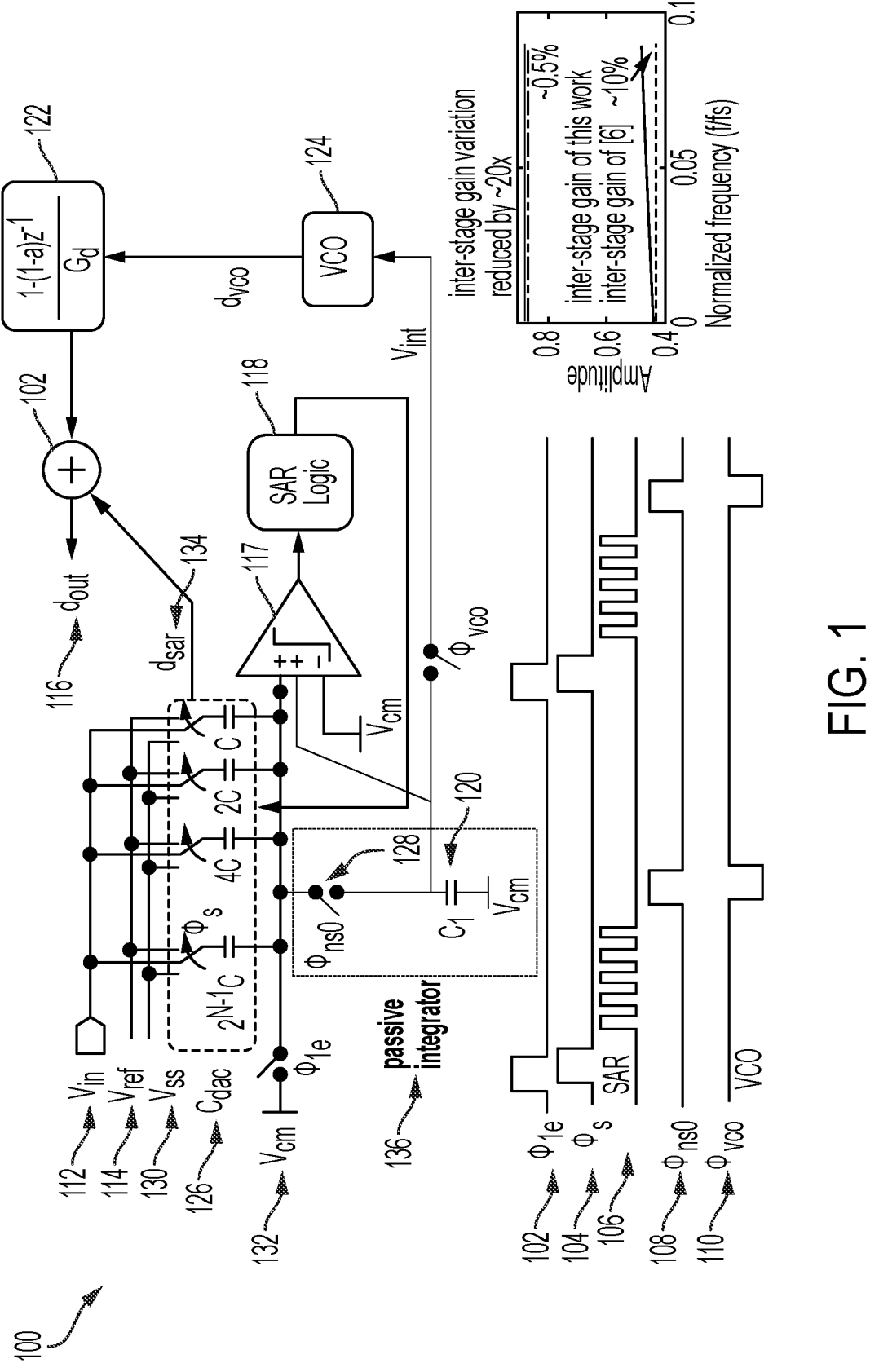
FIG. 1 shows a first circuit schematic and timing diagram of an ADC according to examples of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Noise-shaping successive approximation register (NS-SAR) combines advantages of both SAR and $\Delta\Sigma$ and employs either a passive integrator or an active integrator as loop filter. Passive integrator has advantages of avoiding amplifiers at the cost of weak noise-shaping at low oversampling ratio (OSR). Active integrators with open-loop dynamic amplifiers have simple architecture and high energy efficiency but are sensitive to PVT variations that can potentially make the NS-SAR unstable without background gain calibration. Closed-loop dynamic amplifiers are more robust against PVT variations but need complex optimization. Despite recent advances, state-of-the-art NS-SARs still need high resolution SAR quantizer, i.e., at least 10-bit SAR to achieve >12-bit performance at low OSR which brings the additional challenge of driving a large sampling capacitor. Prior work presented a MASH architecture with NS-SAR as first stage and a ring voltage-controlled oscillator (VCO) as second stage to relax capacitor driving requirements. However, the MASH architecture creates a frequency dependent interstage gain that limits suppression of quantization error from NS-SAR at ADC output and reduces SFDR of the ADC. Further, the VCO is used as integrator only when the NS-SAR is not quantizing which limits energy efficiency of the VCO.

Generally speaking, a pipelined NS-SAR+VCO architecture is provided that addresses the above challenges and brings the following advantages—1) the VCO suppresses quantization error and comparator noise of SAR stage which address weak noise-shaping from passive integrator; 2) the NS-SAR resolution is low (5-bit) which relaxes the requirements for driving sampling capacitor; 3) the passive integrator linearizes VCO by limiting its input swing; 4) pipelining suppresses frequency dependence of interstage gain, and improves SFDR by 8 dB and ADC energy efficiency by 2× compared to the MASH architecture.

Examples of the present disclosure provides for a low-pass and band-pass $\Delta\Sigma$ ADCs for sensor interface by combining low-resolution (<6-bit) passive integrator-based noise-shaping SAR ADC as first-stage and VCO-ADC as subsequent stages with target resolution>14-bits at low supply voltages (<0.5V). This will allow for the study of hybrid voltage-time domain ADC architectures, exploration of design trade-offs to optimize performance, and development of low-pass and band-pass $\Delta\Sigma$ ADCs with at least ~5× improvement in energy efficiency compared to state-of-the-art.

Figure 2:
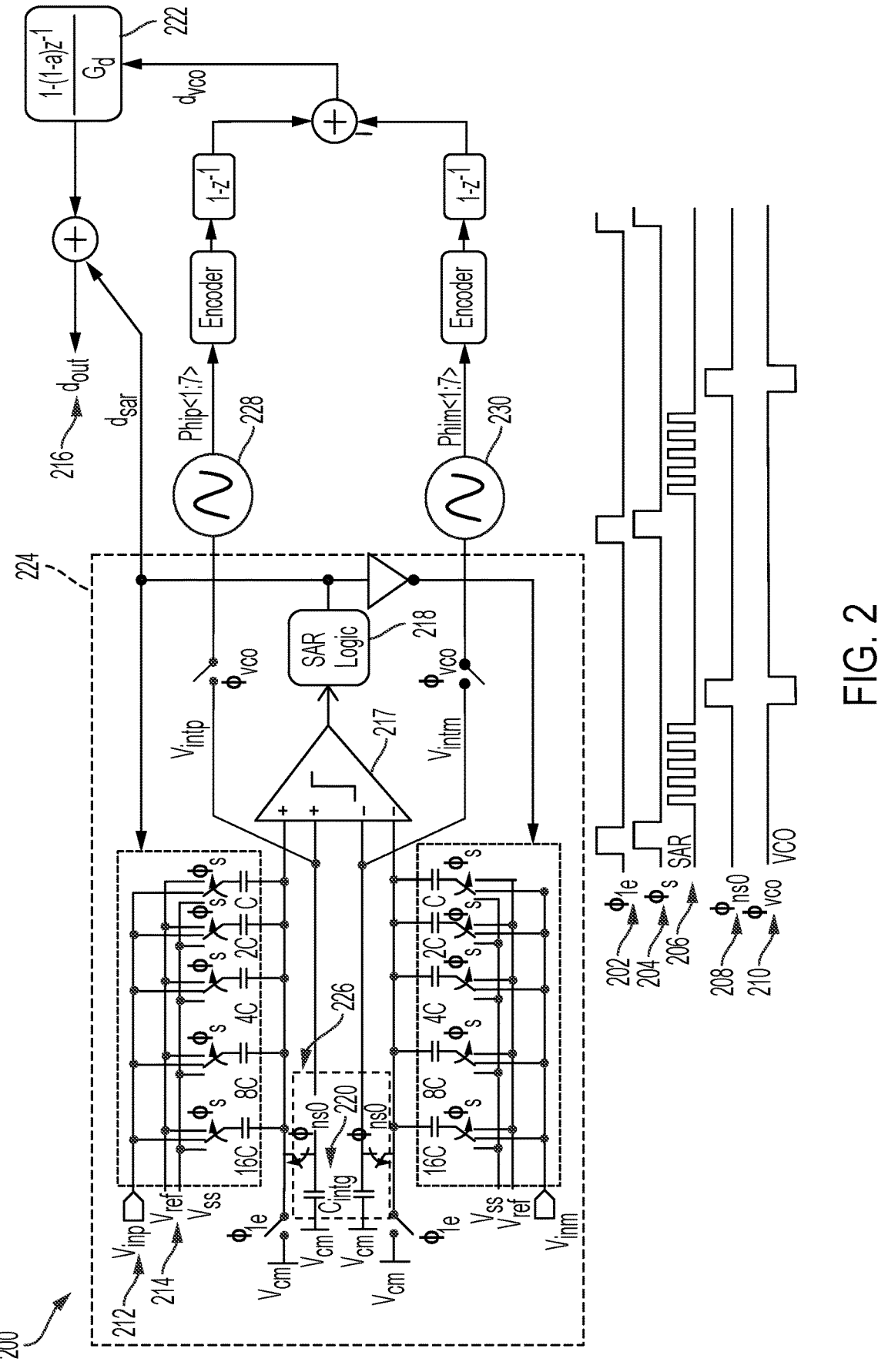
FIG. 2 shows a second circuit schematic and timing diagram of an ADC according to examples of the present disclosure.

According to some examples, the circuit in FIG. 1 and FIG. 2 can be used for a second-order delta-sigma modulator in which the first stage is noise-shaping successive approximation register (SAR) and the second stage is a VCO which is a first-order delta-sigma. So, the quantization noise of the overall ADC is shaped to second order, i.e., the overall ADC is a second-order delta-sigma. In the circuit in FIG. 3, the same noise-shaping SAR is used as first stage and VCO as second stage, but the noise-shaping from the first stage does not contribute to the order in which the overall ADC's quantization noise is shaped, i.e., the overall ADC is a first-order delta-sigma. Noise-shaping in the SAR is instead used to high-pass filter error in matching the gains of first and second stage. Hence, this ADC does not need interstage gain calibration, but the ADC in FIG. 1 and FIG. 2 uses a separate gain calibration circuit.

FIG. 1 shows an example pipelined NS-SAR+VCO ADC with passive integrator in the NS-SAR 100 according to examples of the present disclosure. Pipelined NS-SAR+VCO ADC with passive integrator in the NS-SAR 100 operates according to timing diagrams for $\phi_{1e}$ 102, $\phi_s$ 104, SAR 106, $\phi_{ns0}$ 108, and $\phi_{vco}$ 110. Analog input voltage, $V_{in}$, 112, is compared against reference voltage, $V_{ref}$, 114 using a comparator 117, which is used to generate binary output, $d_{out}$, 116 depending on whether the input voltage, $V_{in}$, 112 is higher or lower than reference voltage, $V_{ref}$, 114. After conversion by SAR logic 118 is over, the residue is dumped on capacitor $C_1$ 120 which realizes passive integration during $\Phi_{ns0}$ phase. Noise transfer function (NTF) 122 of the NS-SAR does not need to be aggressive due to VCO 124 stage, and due to small size of SAR logic 118 DAC, $C_1$ 120 is set to 3× the size of SAR 118 DAC capacitance ($C_{dac}$) 126. Passive integrator 136 that comprises switch 128 that is operated according to timing signal $\phi_{ns0}$ 108 and capacitor $C_1$ 120 output drives the VCO 122 over the remainder of the sampling period. In this arrangement, Vss 130 is 0V (ground), Vcm 132 is half of the supply voltage, and dsar 134 is the output from the first stage. The architecture according to this example brings the following advantages— 1) the 2-stage architecture suppresses quantization noise and comparator noise of SAR stage, thus weak in-band noise suppression in NS-SAR with passive integrator is addressed; 2) the NS-SAR resolution is low (5-bit) due to 2-stage architecture which relaxes the requirements for driving sampling capacitor; 3) direct integration of SAR residue on a larger capacitor instead of charge-sharing with a smaller capacitor ($<C_{dac}$) followed by integration reduces kT/C noise of SAR; 4) attenuation by passive integrator reduces input swing of VCO 124 stage and improves its linearity; 5) pipelining the NS-SAR and VCO 124 allows the VCO 124 to operate over almost the entire sampling period that increases its gain, reduces input referred noise and improves energy efficiency compared to Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021. Due to pipe-lining VCO 124 behaves very similar to a discrete-time (DT) delta-sigma modulator (DSM) (DT-DSM) which reduces frequency dependence of the inter-stage gain by 20× compared to Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021 in which the NS-SAR and VCO 124 operates at different clock phases. Lower frequency dependence of inter-stage gain improves interstage gain calibration accuracy and SFDR.

FIG. 2 shows a pipelined NS-SAR+VCO architecture 100 and associated timing diagrams for $\phi_{1e}$ 202, $\phi_s$ 204, SAR 206, $\phi_{ns0}$ 208, and $\phi_{vco}$ 210 according to examples of the present disclosure. Analog input voltage, $V_{in}$, 212, is compared against reference voltage, $V_{ref}$, 214 using a compara-tor 217, which is used to generate binary output, $d_{out}$, 216 depending on whether the input voltage, $V_{in}$, 212 is higher or lower than reference voltage, $V_{ref}$, 214. Input signal, $V_{inp}$, 212 is sampled during $\phi_s$ 204 and 5 cycles of SAR conver-sion follows the sampling phase. After conversion by SAR logic 218 is completed, the residue is dumped on capacitor $C_{intg}$ 220 which realizes passive integration of the SAR residue during $\phi_{ns0}$ 208 phase. Thus, the NS-SAR effectively behaves as a feedforward ΔΣ modulator 224 with first-order noise shaping with a signal transfer function (STF) of 1 and noise transfer function (NTF) 222 of $[1-(1-a)z^{-1}]$ where $a=C_{dac}/(C_{dac}+C_{intg})$ and $C_{dac}$ is the SAR DAC capacitance. Direct integration of SAR residue on $C_{intg}$ 220 instead of charge-sharing with a small capacitor before integration in Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021 reduces kT/C noise of SAR. The trade-off with direct integration is that $C_{intg}$ 220 needs to be larger than $C_{dac}$ to push NTF zero close to dc and ensure adequate in-band noise suppression. While this would necessitate a large $C_{intg}$ 220 in high-resolution NS-SAR ADCs with large $C_{dac}$, the NS-SAR+VCO ADC, according to this example, uses a low-resolution SAR ADC thus ensuring that $C_{intg}$ 220 is still relatively small. In addition, the pipelined architecture cancels quantization noise in SAR thus relaxing the need for an aggressive NTF. Hence, the ratio of $C_{intg}/C_{dac}$ is set to 3 in this design which results in NTF of $(1-0.75z^{-1})$. The NS-SAR uses a 2-input comparator to add SAR residue and passive integrator output. While a 2-input comparator has higher noise than single input comparator, the pipelined architecture cancels comparator quantization noise and does not affect SNR of the ADC.

Figure 4:
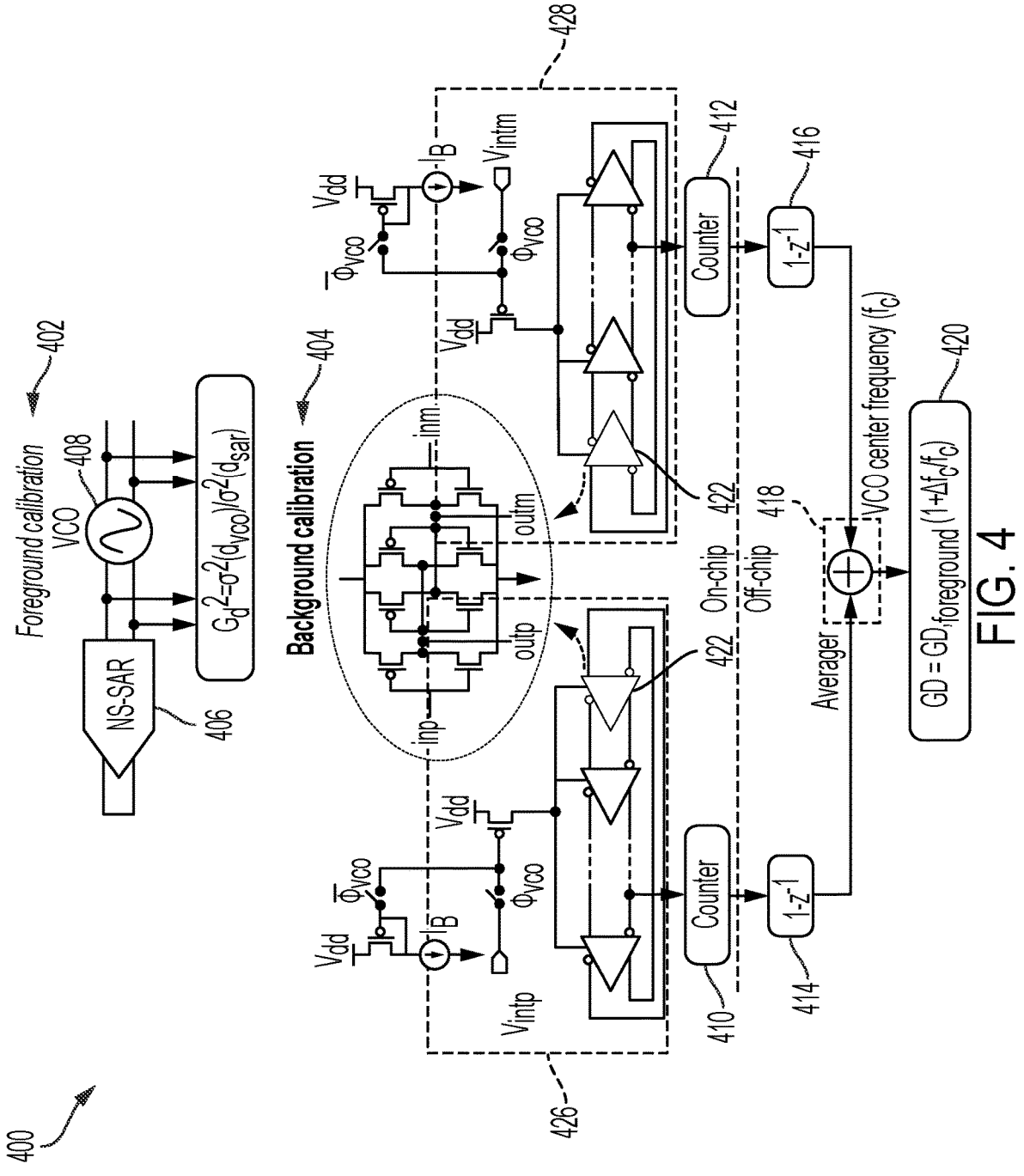
FIG. 4 shows a foreground and background calibration technique to estimate and track interstage gain across PVT according to examples of the present disclosure.

Passive integrator 226 output is sent to VCO 228, 230 for time-domain quantization. Due to pipelining, $C_{intg}$ 220 acts as zero-order-hold for VCO 228, 230 which performs inte-gration over the entire ADC sampling period except for $\phi_{ns0}$ 208 as shown in FIG. 2. This improves signal-to-quantiza-tion-noise-ratio, also known as quantization noise, (SQNR) of VCO 228, 230 and reduces frequency dependence of interstage gain. FIG. 4 shows the circuit schematic for the second-stage VCO. A seven-stage current-starved ring inverter chain is used as the VCO. At any given time only one of the seven inverters in each VCO stage is undergoing transition, rising or falling. Thus, the 7-stage VCO quantizes the phase interval $(0,2\pi)$ into 14 levels corresponding to 7 rising transitions and 7 falling transitions. The quantized phase is in one-hot format that a phase encoder converts to binary word. The binary phase output is digitally differen-tiated to form the VCO stage output. The VCO output is digitally differentiated with NTF of NS-SAR and combined with the SAR output after scaling by interstage gain to form the overall ADC output.

Figure 3:
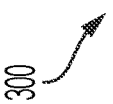
FIG. 3 shows a third circuit schematic and timing diagram of an ADC according to examples of the present disclosure.

FIG. 3 shows a low-pass ΔΣ ADC 300 and associated timing diagrams for $\phi_{1e}$ 302, $\phi_s$ 304, SAR 306, $\phi_{ns0}$ 308, $\phi_{ns1}$ 310, and $\phi_{vco}$ 312 according to examples of the present disclosure, that is inherently robust against interstage gain errors and VCO tuning errors. Analog input voltage, $V_{in}$, 314, is compared against reference voltage, $V_{ref}$ 316 using comparator 328, which is used to generate binary output, $d_{out}$, 318 depending on whether the input voltage, $V_{in}$, 314 is higher or lower than reference voltage, $V_{ref}$, 316. The residue from the SAR conversion by SAR logic 320 is sent to VCO 322 for finer quantization after charge sharing with capacitor ($C_1$) 324, which can be small. Capacitor ($C_1$) 324 and Capacitor ($C_2$) 326 realize passive integration by dump-ing the charge on $C_1$ 324 onto $C_2$ 326 every cycle as shown in FIG. 3. Combination of NS-SAR and VCO has several advantages: 1) signal attenuation by passive integrator lin-earizes the VCO even with a relatively low-resolution from the SAR stage; 2) suppresses quantization noise from NS-SAR and improves the weak in-band quantization noise in standalone NS-SAR stage; 3) multi-input comparator noise in NS-SAR stage is suppressed by the combined architec-ture; 4) the NS-SAR resolution can be low which relaxes the driving requirements for the SAR capacitive DAC; 5) addi-tional residue amplifier is not required since VCO stage provides inherent time-domain amplification; 6) the overall architecture is highly digital and scaling friendly. In contrast to prior work described in Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", *JSSC*, pp. 1100-1111, vol. 57, no. 4, 2021 and Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", *VLSI-C*, 2021 in which the passive integrator output from the SAR stage is sent to the VCO, the disclosed technique sends the SAR conversion residue to the VCO for time-domain quantization. This technique has an advantage of high-pass shaping interstage gain mismatch since the NS-SAR high-pass shapes SAR quantization noise, and any error in interstage gain is also shaped by NTF of the NS-SAR stage as shown in FIG. 3. Passive integration still attenuates the signal seen by the VCO stage by a factor of 1/k (where k is the NTF zero for the NS-SAR stage) which linearizes the VCO even though the attenuation factor is lowered by k/(k+1) compared to Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", *JSSC*, pp. 1100-1111, vol. 57, no. 4, 2021 and Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", *VLSI-C*, 2021 in which the passive integrator output drives the VCO stage instead of SAR conversion residue.

$$d_{sar} = V_{in} + [1 - (1-a)z^{-1}](Q_1 + n_{comp}) + n_{kT/c} \text{ where STF}=1$$

The above ADC architectures can be further optimized for the highest energy efficiency and dynamic range and non-idealities in sensor interface can be further addressed, such as the mismatch between the differential inputs and time-varying input offset. To address capacitive mismatch in the NS-SAR stage, a dynamic element matching (DEM), such as randomization or data-weighted averaging (DWA), can be used. Optimization of the ADC architecture for energy-efficiency involves determining the following parameters— resolution of NS-SAR stage, NTF zero location for the NS-SAR stage, SAR comparator noise, number of inverters in the VCO stage and VCO integration time. For second-order VCO stage, additional design criteria include optimization of DAC gain in the feedback loop which is tightly coupled with VCO integration time and number of inverters in the VCO stage for optimum energy efficiency. Resolution of the NS-SAR, comparator noise and NTF zero location are tightly coupled. Keeping the DAC capacitance constant and for a constant ADC resolution, increasing NS-SAR resolution beyond a certain limit reduces ADC energy efficiency significantly since the comparator power increases by 4× for every 1-bit increase in NS-SAR resolution. While the comparator noise is suppressed in the overall ADC output, the comparator noise must be adequately small so as not to over-range the VCO stage. At the same time, reducing comparator noise too much increases ADC power without improving its overall resolution. The NTF zero changes the input-referred kT/C noise from the NS-SAR stage and the input swing seen by the VCO which affects ADC energy efficiency. In addition, pushing the NTF zero of the NS-SAR stage closer to dc improves high-pass shaping of interstage gain error, and makes the ADC more robust to variations in interstage gain. Increasing VCO integration time while ensuring that the VCO does not over-range improves VCO input referred thermal noise, and upper limit on the integration time is set by VCO quantization error which limits energy efficiency if the integration time is too high. Similarly, the ADC energy efficiency is limited by in-band thermal noise at small number of inverters in the VCO stage, and by the VCO power for large number of inverters. Thus, all the design parameters are tightly coupled, and a key research aim is to explore the design space to optimize the ADC's energy efficiency and resolution. In addition to ADC parameter optimization, another scope for innovation is developing a passive integrator architecture in the NS-SAR stage that reduces kT/C noise from the switches in the passive integrator as well as pushes the NTF zero closer to DC without increasing the total capacitance in the NS-SAR. One solution is re-designing the charge-share capacitor ($C_1$ 324 in FIG. 3) to reduce the fraction of charge dumped into the integrating capacitor ($C_2$ 326 in FIG. 3) without reducing the value of $C_1$ 324. For low supply voltage and high target resolution ADC, other potential scope of innovation is reducing the effect of voltage supply ripple and unwanted coupling (coupling of signal with clock and substrate coupling) is disclosed in both circuit design and layout approaches.

While the disclosed technique high-pass shapes interstage gain error, the overall quantization noise shaping comes only from the second stage. A MASH version of the disclosed architecture in which passive integrator output from the NS-SAR stage is quantized by the VCO stage which increases noise-shaping order but does not high-pass shape interstage gain error can be used. A background calibration can be used to track and suppress interstage gain error. The background calibration technique involves driving a counter using the output of a single inverter from the VCO stage when the SAR is in its conversion phase. The counter output can be used as an indicator for shift in VCO center frequency and use a feedback loop with low-pass FIR filter to digitally trim the Gm-stage which biases the VCO and cancel interstage gain mismatch. While NS-SAR stage is relatively robust against PVT variations, the VCO is susceptible to small variations in PVT. Interstage gain error shaping provides some degree of robustness against PVT variations, but large PVT variations can result in VCO over/under-range and significantly degrade ADC resolution. The background VCO center frequency tracking is expected to correct for large changes in PVT and stabilize the ADC performance.

FIG. 4 shows the calibration technique 400 that includes both foreground calibration 402 and background calibration 404. Foreground calibration 402 may run once at chip startup to extract the interstage gain and background calibration 404 keeps running during normal operation to track the interstage gain with changes in voltage/temperature. During foreground calibration 402, the ADC differential input is set to 0, and the output of NS-SAR 406 is dominated by its high-pass shaped quantization error due to low-resolution (5-bit) of NS-SAR 406, while output of the VCO 408 is dominated by the high-pass shaped quantization error from NS-SAR stage scaled by interstage gain. Thus, ratio of variance of VCO outputs to variance of NS-SAR output gives square of the interstage gain. The NS-SAR NTF zero location is extracted in the foreground using Nedler-Mead optimization. Since the NS-SAR NTF zero is set by ratio of capacitors, background calibration 404 is not required for tracking its location. During background calibration 404, the ADC operates normally and the 2π-crossing points of the differential VCOs are recorded by counters 410, 412 that operate at rising edges of one inverter 422, 424 from each VCO 426, 428. The outputs from counters 410, 412 are differentiated by differentiator 414, 416, respectively, and added together by adder 418, and temporal average of the sum 420 represents the free-running frequency of the VCOs. Variations in PVT are captured in the temporal average, and the interstage gain is updated in the background by multiplying the interstage gain calculated using foreground calibration with fractional change in VCO frequency.

Figure 5:
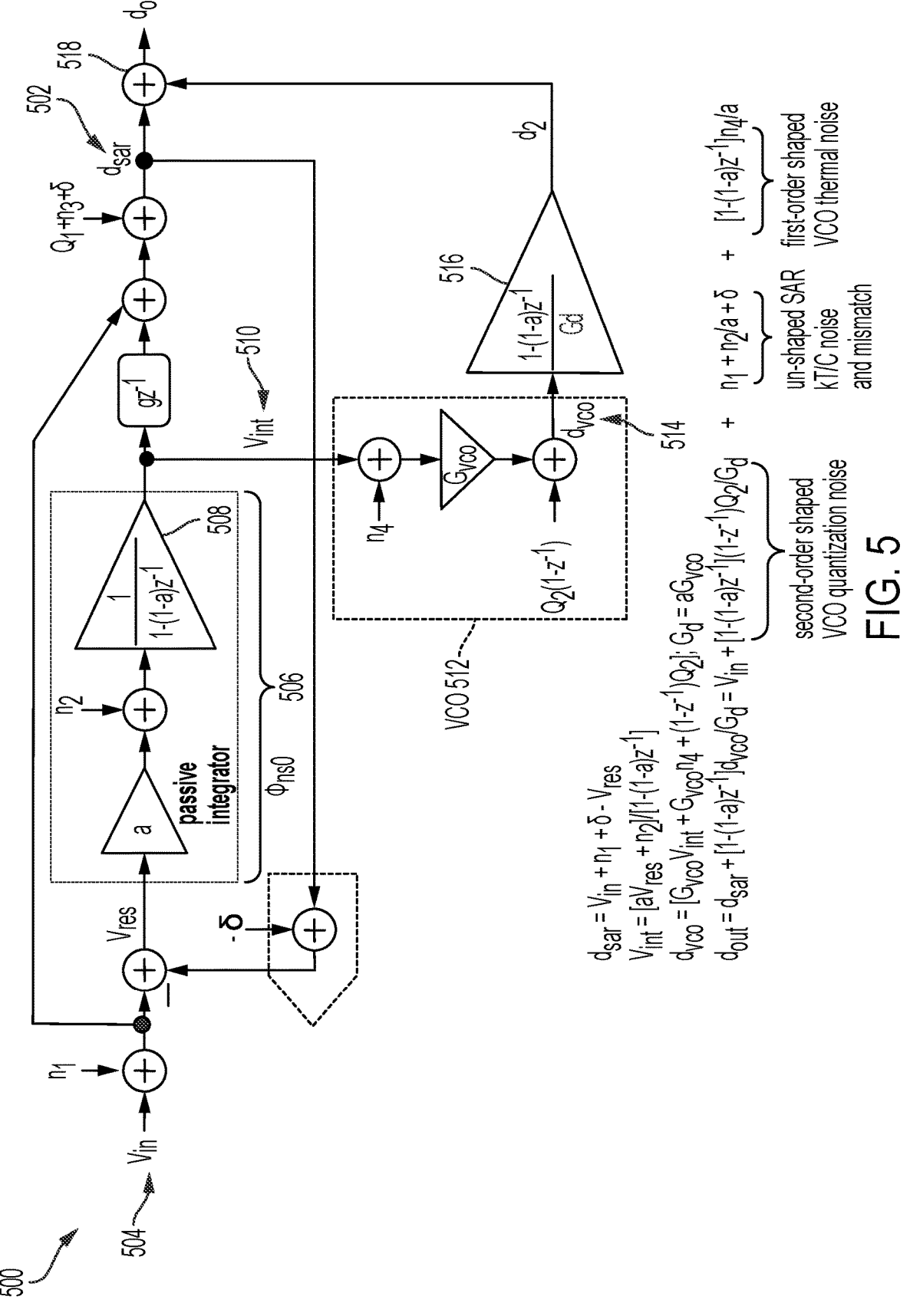
FIG. 5 shows a mathematical model of the ADC according to examples of the present disclosure.

FIG. 5 shows a simplified mathematical model 500 of the ADC and its transfer functions according to examples of the present disclosure. kT/C noise in SAR DAC and passive integrator are denoted by $n_1$ and $n_2$ respectively, $g=1/a$ is gain of the integration path in the comparator, $Q_1$ is quantization noise in SAR, $n_3$ is thermal noise of comparator, $\delta$ represents capacitance mismatch error in SAR DAC, $n_4$ is VCO input-referred thermal noise, Gvco is VCO tuning gain, $Q_2$ is quantization noise in the VCO and $G_d$ is interstage gain. The ADC has very low sensitivity to g and precise matching/calibration is not needed to accurately set the value of g. After combining the NS-SAR and VCO outputs with the correct interstage gain, noise in the ADC output comprises of second-order shaped VCO quantization noise, first-order shaped VCO thermal noise, and unshaped DAC mismatch error and kT/C noise from the NS-SAR stage which forms the in-band noise floor. The ratio of $C_1/C_{dac}$ is $(1-a)/a$ which sets the NTF zero of the NS-SAR stage at $z=(1-a)=0.75$ for $C_1=3C_{dac}$. The NS-SAR uses a two-path comparator with a gain of $g=1/a$ for the integration path. The ADC has very low sensitivity to g and precise matching/calibration is not needed to accurately set the value of g. After combining the NS-SAR and VCO outputs with the correct interstage gain, noise in the ADC output comprises of second-order shaped VCO quantization noise, first-order shaped VCO thermal noise, and unshaped DAC mismatch error and kT/C noise from the NS-SAR stage which forms the in-band noise floor.

As shown in FIG. 5, the NS-SAR output is denoted by $d_{sar}$ 502 which comprises of the input signal 504, $V_{in}$, kT/C sampling noise, capacitance mismatch error and the residue of the SAR conversion. The residue is integrated with a passive integrator 506 with transfer function $1/[1-(1-a)z^\wedge(-1)]$ 508 and result is denoted by $V_{int}$ 510. $V_{int}$ 510 acts as input to the second stage VCO 512 which quantizes $V_{int}$ 510. Output of the VCO 512 is denoted by $d_{vco}$ 514 and comprises scaled $V_{int}$, thermal noise of VCO 512 and its quantization error which is first-order shaped. Output of the VCO 512 is filtered by filter 516 using $[1-(1-a)z^\wedge(-1)]$, scaled down by interstage gain, Gd, and added by adder 518 to output $d_{sar}$ 502 from NS-SAR. Filtering and scaling of VCO output cancels quantization error in the NS-SAR stage and the combined ADC output has second-order shaped quantization error from VCO stage, kT/C noise from the NS-SAR stage and VCO's thermal noise. FIG. 5 operates according to the following equations.

$$d_{sar}=V_{in}+n_1+\delta-V_{res}$$

$$V_{int}=[aV_{res}+n_2]/[1-(1-a)z^{-1}]$$

$$d_{vco}=[G_{vco}V_{int}+G_{vco}n_4+(1-z^{-1})Q_2];G_d=aG_{vco}$$

$$d_{out}=d_{sar}+[1-(1-a)z^{-1}]/G_d=$$

$V_{in}+[1-(1-a)z^{-1}](1-z^{-1})Q_2/G_d+n_1+n_2/a+\delta+[1-(1-a)z^{-1}]n_4/a$ where $[1-(1-a)z^{-1}(1-z^{-1})Q_2/G_d]$ is the second-order shaped VCO quantization noise, $n_1+n_2/a+\delta$ is the un-shaped SAR kT/C noise and mismatch, and $[1-(1-a)z^{-1}]n_4/a$ is the first-order shaped VCO thermal noise.

Figures 6A, 6B, 6C:
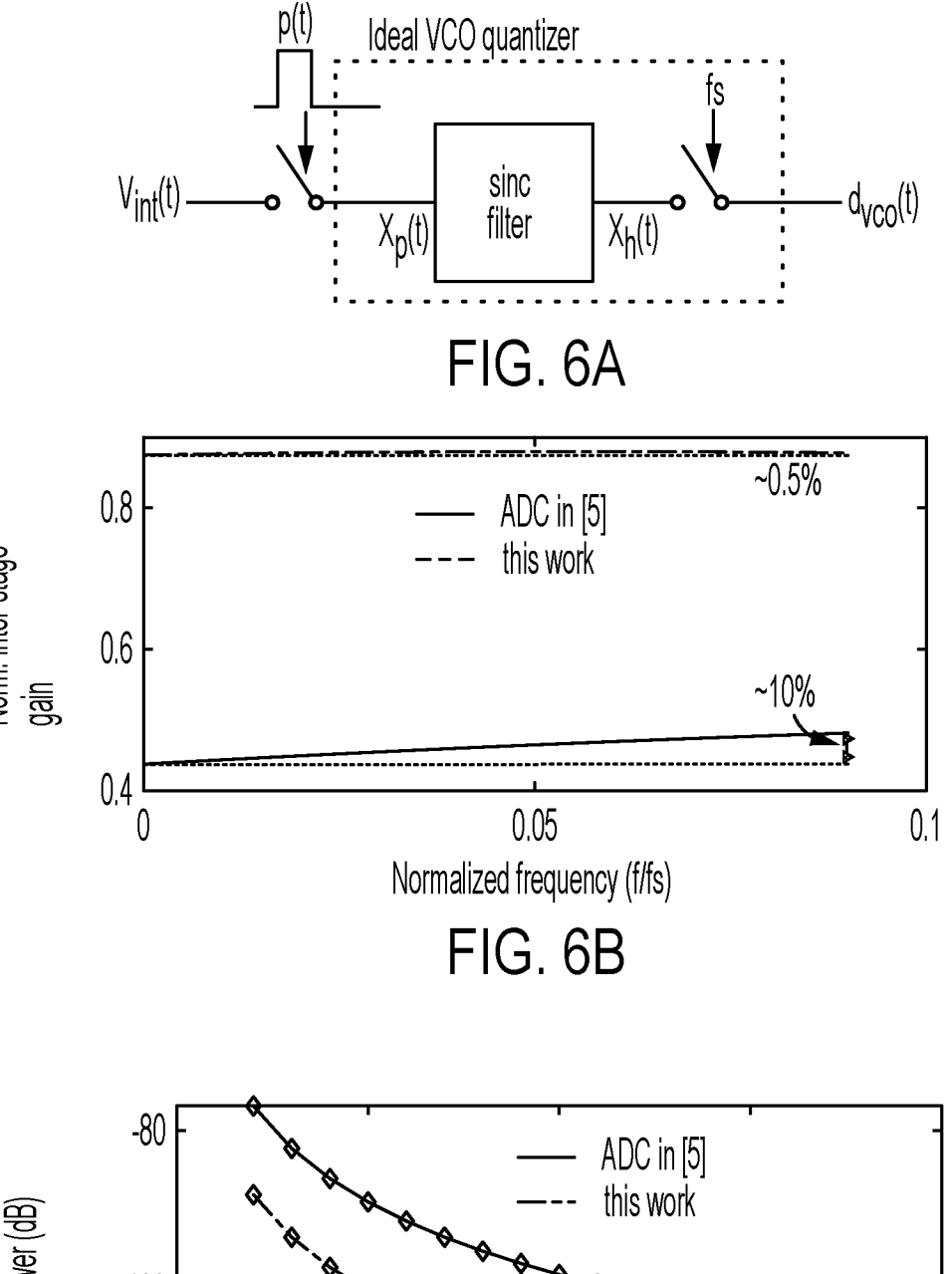
FIG. 6A shows a simplified block diagram of passive mixing and idea VCO back-end quantizer.
FIG. 6B shows a plot showing normalized inter-stage gain vs. frequency.
FIG. 6C shows a plot showing in-band SAR quantization noise power comparison between Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021 and examples of this disclosure according to examples of the present disclosure.

The interface between discrete-time (DT) SAR and continuous-time (CT) VCO introduces reconstruction error when outputs from the two stages are combined. Since the VCO quantizes the passive integrator output over a fraction of the ADC sampling period (during $\phi_{vco}$ phase in FIG. 1, FIG. 2, and FIG. 3), this effectively realizes a passive mixer in front of the VCO as shown in FIG. 6A). Mixing spreads out frequency spectrum of the passive integrator output and creates multiple copies around harmonics of the ADC sampling frequency $f_s$. Antialiasing in the VCO attenuates the mixer output in higher nyquist bands and hence the sampled VCO output is not a perfect reconstruction of the passive integrator output even if the VCO was an ideal quantizer. Thus, the interstage gain is frequency dependent and quantization noise from the first stage cannot be completely canceled at the ADC output.

Assuming the passive mixer is controlled by a pulse train $p(t)=a_0+\Sigma_{n=1}^{\infty}a_n\cos(2\pi nf_st)$, where $a_0$ is the duty-cycle of $\phi_{vco}$. FIG. 6B shows plots the interstage gain normalized by $G_d$ for Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021 and for examples of the present disclosure. For the same ADC sampling frequency, pipelining increases the duty-cycle of $\phi_{vco}$ by 2× in examples of this disclosure and reduces inter-stage gain variation with frequency by 20× compared to that in Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021. The in-band quantization noise of the NS-SAR stage at the ADC output with an ideal VCO back-end can be written as $$p_q = \frac{\left[1 + (1-a)^2 - 2(1-a)\right]}{12(OSR)^3}\frac{\Delta^2}{12}\left(\sum_{n=1}^{\infty}\frac{a_n}{n}\right)^2$$

where $$a_n = \frac{2}{n\pi}\sin\left(\frac{nd\pi}{2}\right),$$

and $\Delta^2/12$ is quantization noise power of the 5-bit SAR. Longer duty cycle of p(t) results in more attenuation of the in-band quantization error from NSSAR stage. Thus, pipelining NSSAR+VCO attenuates quantization noise from NS-SAR by more than 10 dB compared to examples of the present disclosure and in Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021 as shown in FIG. 6C.

Figure 7:
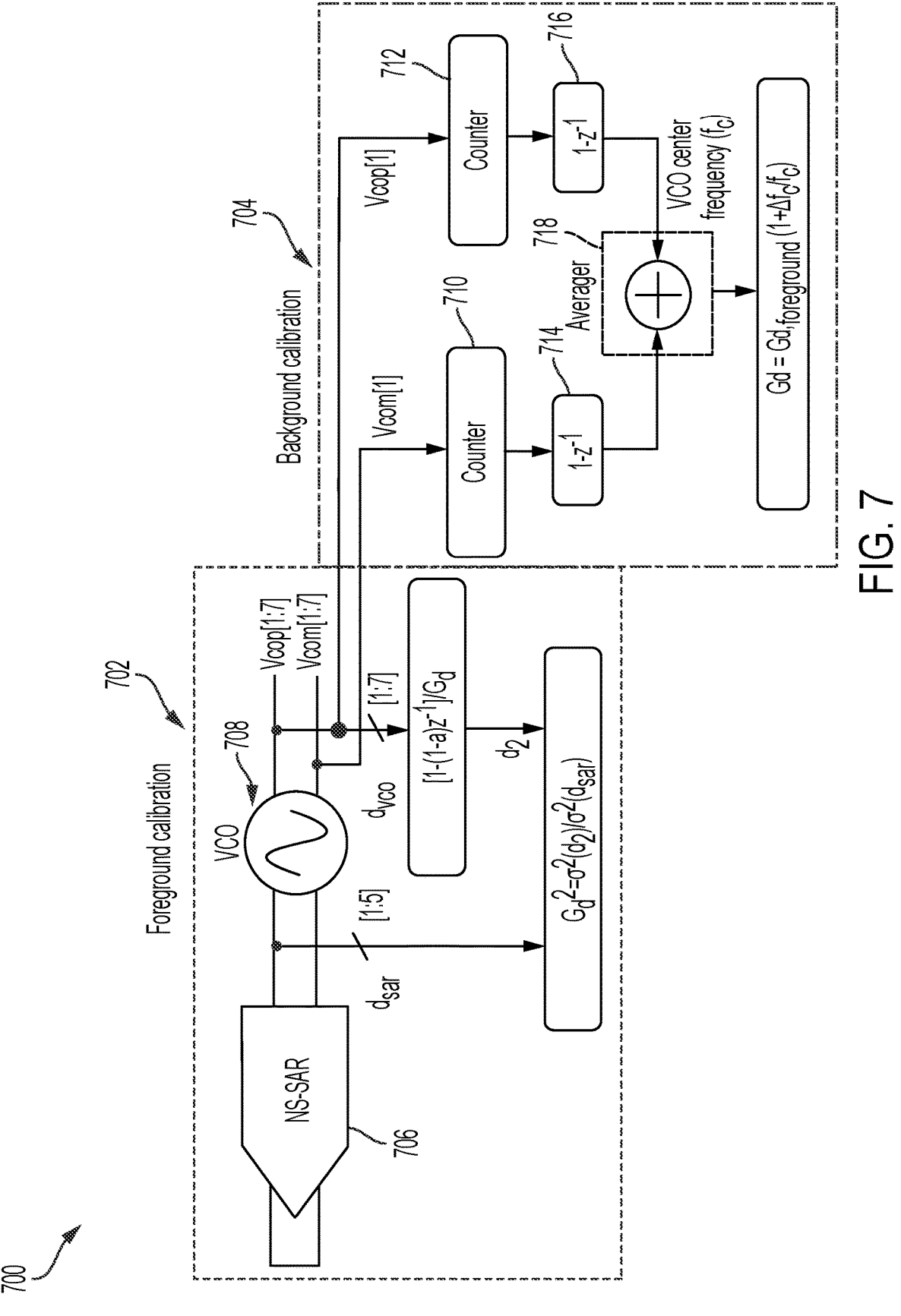
FIG. 7 shows a foreground and background calibration technique to estimate and track interstage gain across PVT according to examples of the present disclosure.

FIG. 7 shows calibration method 700 that employs a combination of foreground calibration 702 and background calibration 704 techniques according to examples of the present disclosure. Foreground calibration 702 runs once at chip startup to extract the interstage gain and background calibration 704 keeps running during normal operation to track the interstage gain with changes in voltage/temperature. During foreground calibration 702, the ADC differential input is set to 0, and the output of NS-SAR 706 is dominated by its high-pass shaped quantization error due to low-resolution (5-bit) of NS-SAR 706, while the output of VCO 708 is dominated by the high-pass shaped quantization error from NS-SAR stage scaled by interstage gain. The variance of SAR output can be written as $$\sigma^2(d_{sar})=\sigma^2(\{1-(1-a)z^{-1}\}Q_1)+\sigma^2(n_1)+\sigma^2(\{1-(1-a)z^{-1}\}n_3)+\sigma^2(n_2)/a^2\approx\sigma^2(\{1-(1-a)z^{-1}\}Q_1)$$

where the in-band quantization noise power of SAR stage dominates the thermal noise sources. Similarly, variance of VCO output after passing through $[1-(1-a)z^{-1}]$ filter, $d_2=[1-(1-a)z^{-1}]d_{vco}$, can be written as $$\sigma^2(d_2) \approx [G_{vco}a]^2 \sigma^2(\{1-(1-a)z^{-1}\}Q_1)$$

Thus, ratio of variance of filtered output of VCO 708 to variance of the output of NS-SAR 706 gives the square of the interstage gain. The NS-SAR NTF zero location is extracted in the foreground using Nedler-Mead optimization. Since the NS-SAR NTF zero is set by ratio of capacitors, background calibration 704 is not required for tracking its location. During background calibration 704, the ADC operates normally and the $2\pi$-crossing points of the differential VCOs are recorded by counters 710, 712 that operate at rising edges of 1 inverter from each VCO 708. The output of counters 710, 712 are differentiated by differentiators 714, 716 and added together by adder 718, and temporal average of the sum represents the free-running frequency of the VCOs. Variations in PVT are captured in the temporal average, and the interstage gain is updated in the background by multiplying the interstage gain calculated using foreground calibration with fractional change in VCO frequency as shown in FIG. 7.

Figure 8A:
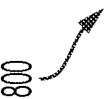
FIG. 8A shows die micro-photo according to examples of the present disclosure.
Figure 8B:
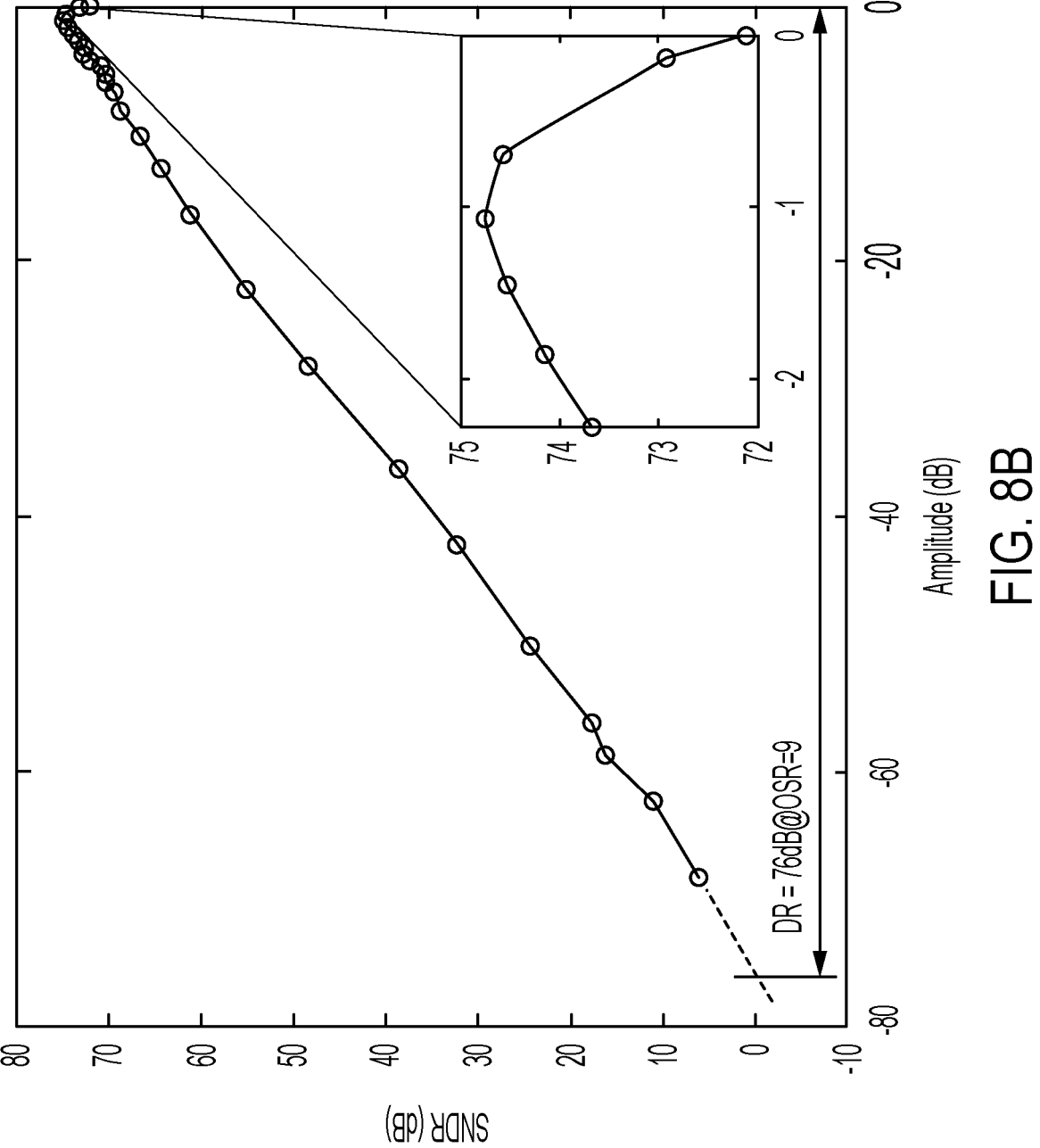
FIG. 8B shows a plot of ADC dynamic range according to examples of the present disclosure.

FIG. 8A shows a die photo 800 of an ADC that is fabricated in 65 nm CMOS process according to examples of the present disclosure. The ADC consumes 120 μW at 18.75 MHz operating frequency. The NS-SAR consumes 74.4 μW from 1.2V supply while the VCO and background calibration circuit consumes 45.6 μW from 0.95V supply. FIG. 8B shows a plot of the measured SNDR versus input amplitude for OSR of 9. The ADC has a measured dynamic range of 76 dB.

Figure 10:
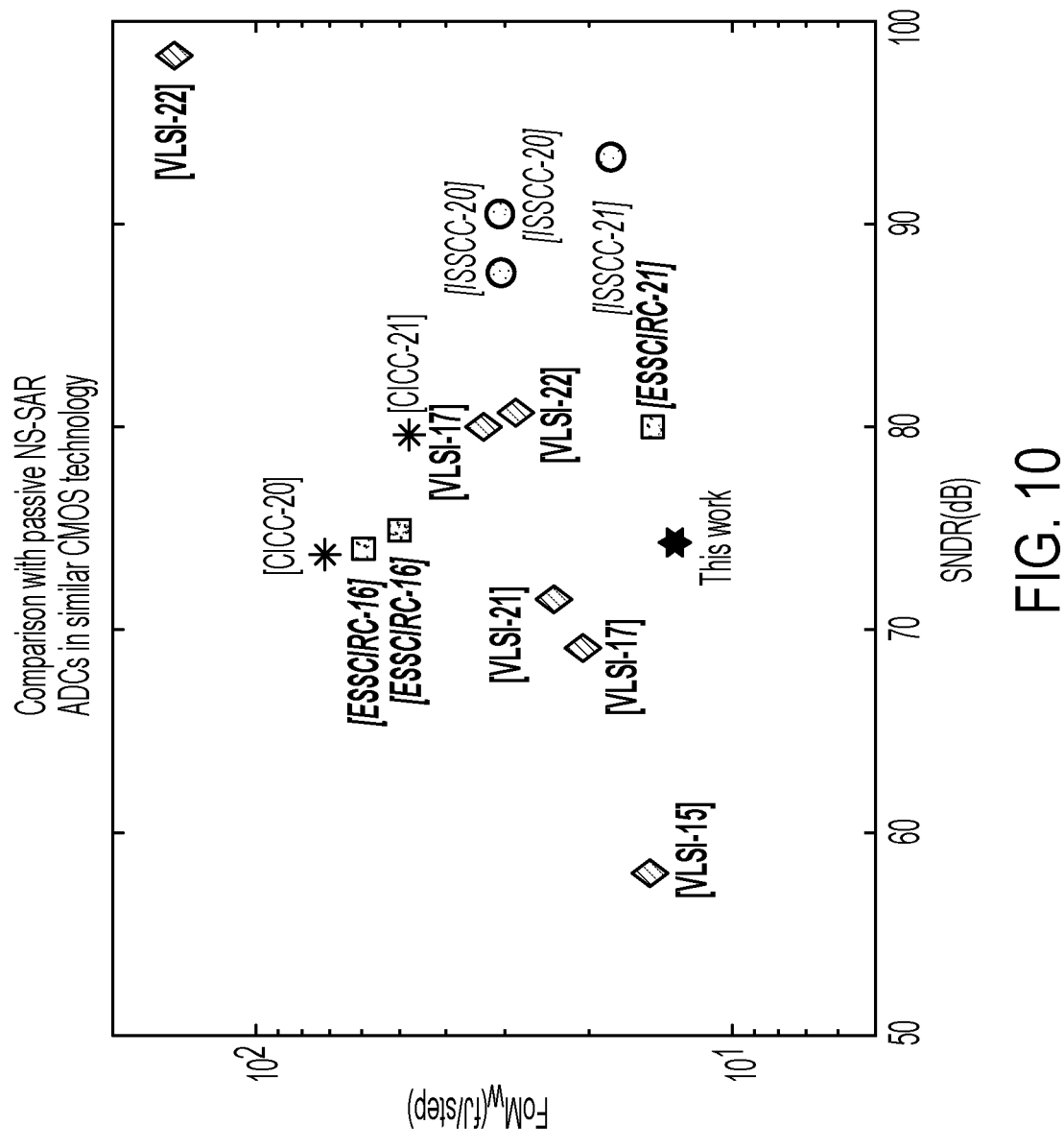
FIG. 10 shows a plot based on the table shown in FIG. 9.

FIG. 9 shows a table comparing examples of the present disclosure and other types of NS-SAR ADCs. FIG. 10 shows a plot that compare examples of the present disclosure with passive NS-SAR ADCs in similar CMOS technology.

Figure 11:
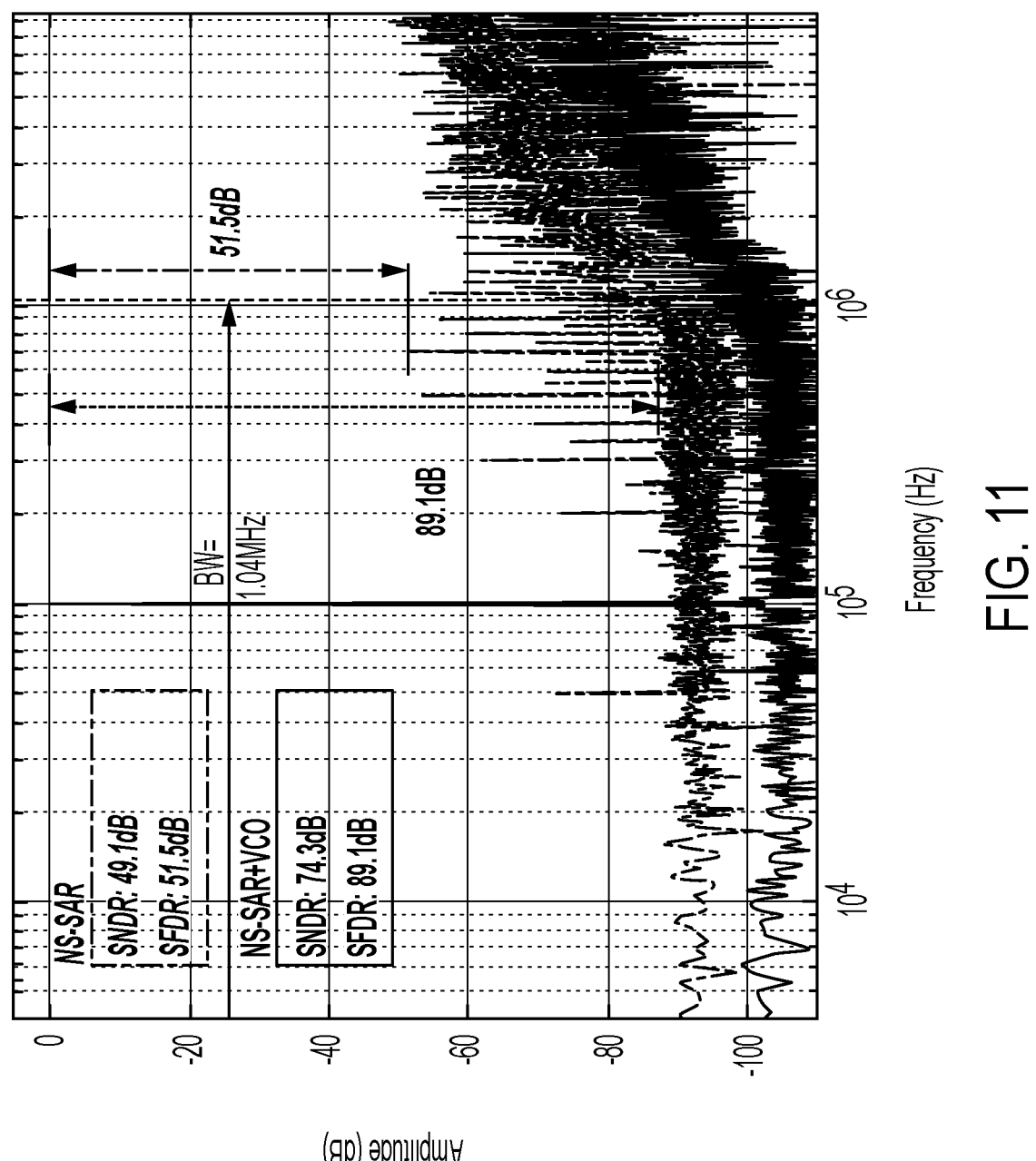
FIG. 11 shows a plot of measured FFT with 100 kHz input frequency according to examples of the present disclosure.

FIG. 11 shows a plot of the measured FFT of the test-chip with 100 kHz sinusoidal input. The VCO stage suppresses quantization error tones from NS-SAR by >35 dB, reduces in-band noise floor by >25 dB and improves SFDR by 8 dB compared to Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021.

FIG. 12A and FIG. 12B show plots of SNDR as a function of input frequency and SNDR for multiple test-chips at OSR of 9 respectively. FIG. 12C and FIG. 12D show plots of SNDR variation with supply voltage and temperature with 100 kHz input frequency and OSR of 9 respectively. Reduction in supply voltage reduces ADC SNDR, but background calibration improves SNDR by 11 dB at 15% reduction in supply voltage. Background calibration also improves SNDR by 15 dB in the temperature range from 40° C.-70° C. The table shown in FIG. 9 summarizes performance of the test chip and compares with state-of-the-art. The ADC achieves the best walden FoM among passive NS-SAR ADCs in similar process and needs only a 5-bit SAR with 1.1 pF sampling capacitor compared to 4-36 pF needed by state-of the-art NS-SAR to achieve high ENOB at low OSR. Thanks to the pipelined architecture, the disclosed ADC has higher SNDR and 2× better energy-efficiency than Sanjeev T. Chandrasekaran, Sumukh P. Bhanushali, Stefano Pietri, and Arindam Sanyal, "OTA-free 1-1 MASH ADC using Fully Passive Noise Shaping SAR & VCO ADC", IEEE Journal of Solid-State Circuits, pp. 1100-1111, vol. 57, no. 4, 2021.

Figure 13A:
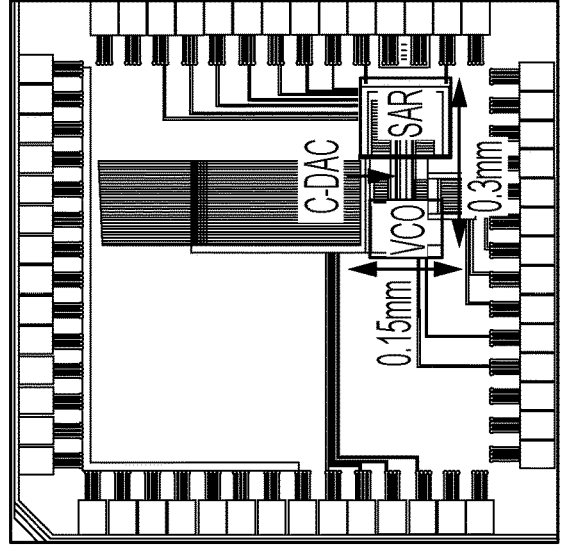
FIG. 13A and FIG. 13B show silicon prototypes of prior highly digital 12-bit ADCs employing SAR and VCO quantizers and performance comparison with state-of-the-art oversampling ADCs in technologies from 40 nm-65 nm.
Figure 13A:
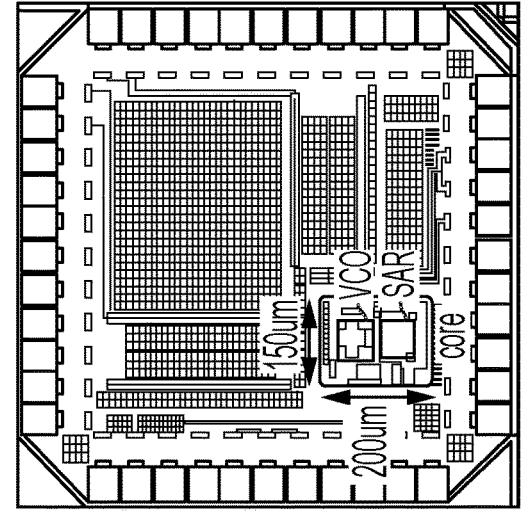
Figure 13A:
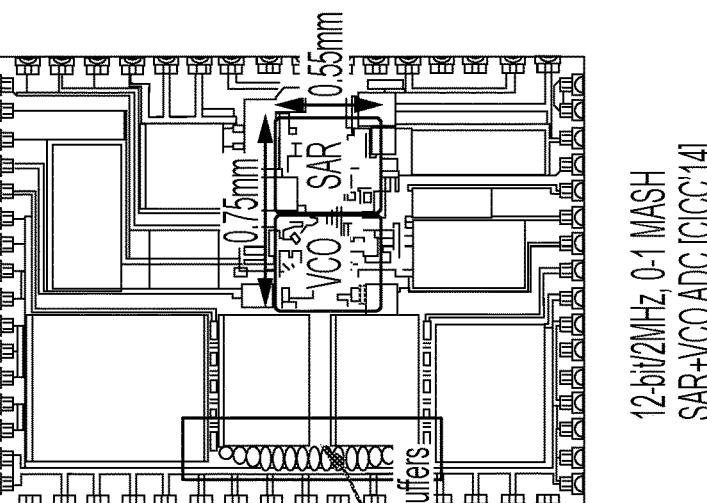
Figure 13B:
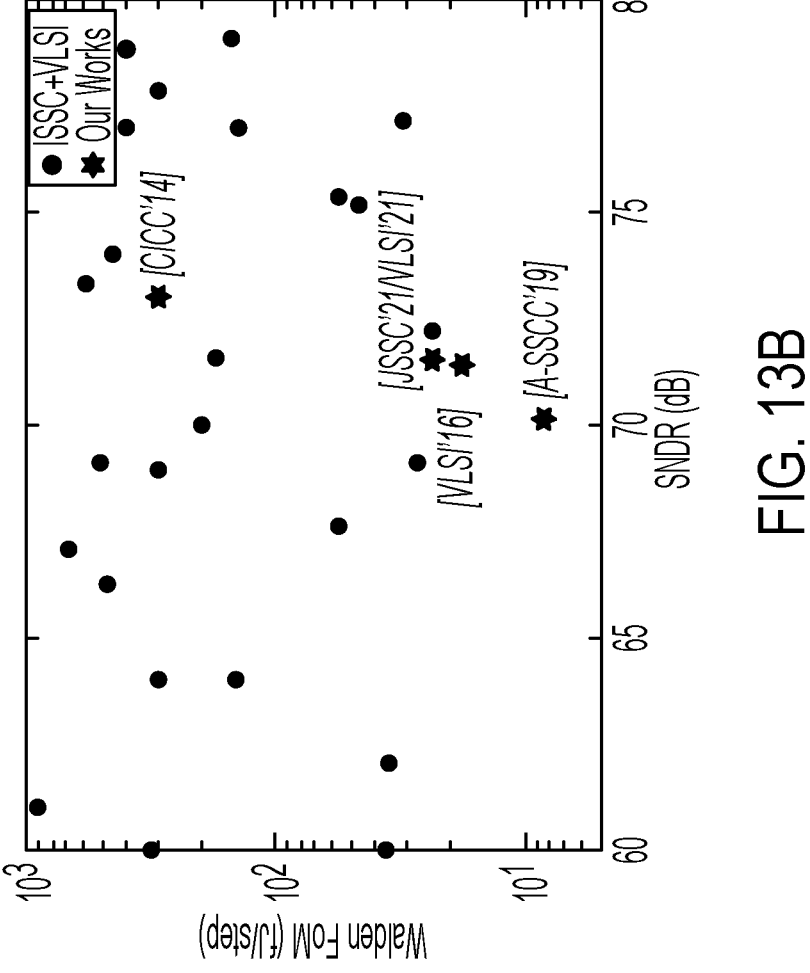

FIG. 13A and FIG. 13B show silicon prototypes of prior highly digital 12-bit ADCs employing SAR and VCO quantizers and performance comparison with state-of-the-art oversampling ADCs in technologies from 40 nm-65 nm according to examples of the present disclosure.

Figures 14A, 14B:
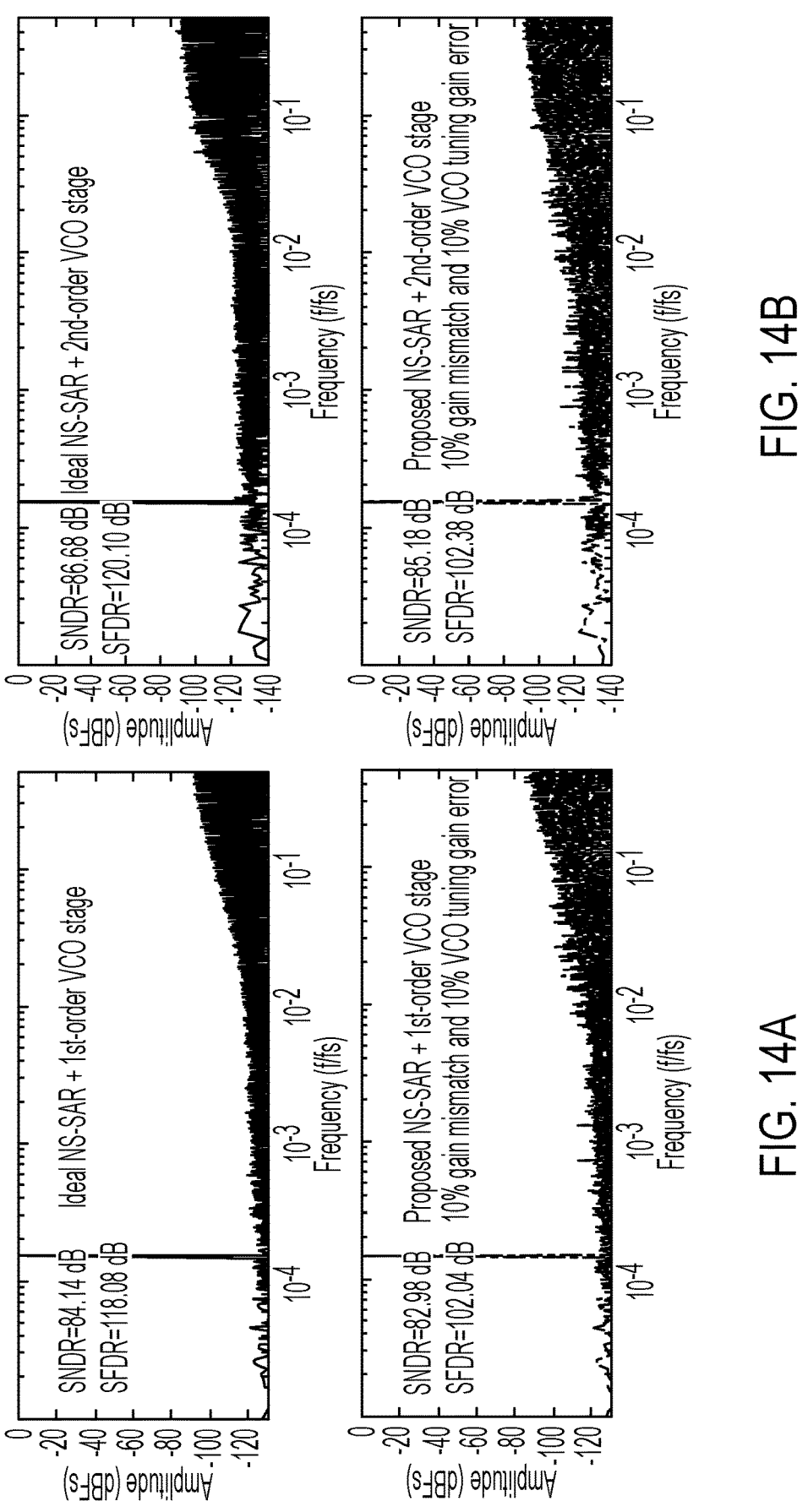
FIG. 14A and FIG. 14B show simulation results for NS-SAR+VCO low-pass ADC architectures that high-pass shape interstage gain error according to examples of the present disclosure.

FIG. 14A and FIG. 14B shows plots of simulation results showing the disclosed NS-SAR+VCO low-pass ADC architectures that high-pass shape interstage gain error according to examples of the present disclosure, where FIG. 14A shows simulation results with NS-SAR+open-loop VCO and FIG. 14B shows plots of simulation results with NS-SAR+prior closed-loop second-order VCO described in Akshay Jayaraj, Abhijit Das, Srinivas Arcot and Arindam Sanyal, "8.6 fJ/Step VCO-Based CT 2nd-Order Delta Sigma ADC", IEEE Asian Solid-State Circuits Conference (A-SSCC), 2019. The NS-SAR has 6-bit resolution, the VCO quantizer has 14 levels (7-stage ring inverter) for both the ADCs and OSR of 20 is used for the simulations. As shown in FIG. 14A and FIG. 14B, even with 10% interstage gain error and 10% error in VCO tuning gain, the SNDR reduces by ~1 dB for both the ADCs which shows the effectiveness of high-pass shaping of interstage gain error.

Figure 15A:
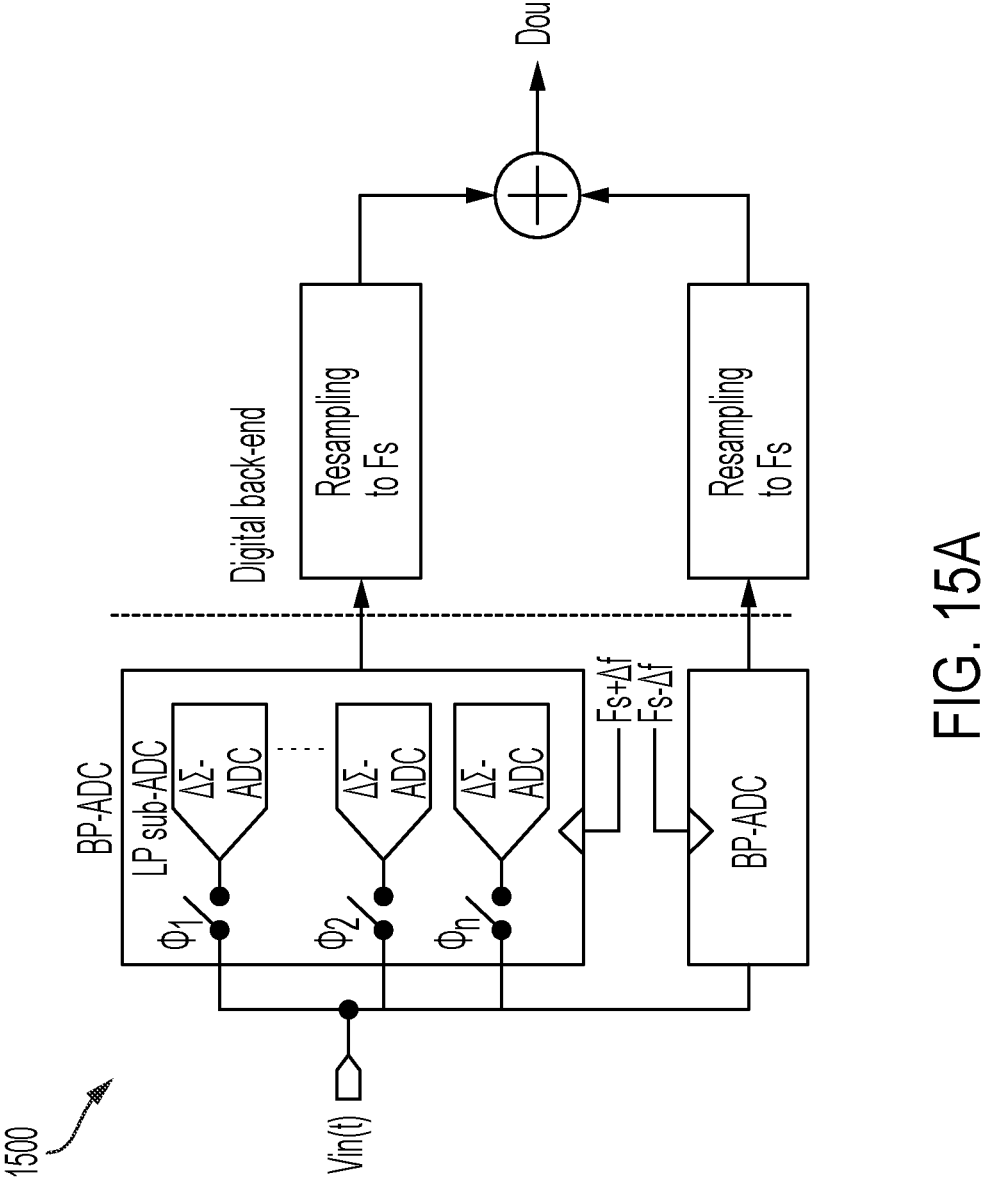
FIG. 15A shows a frequency-time-interleaving technique to create band-pass ADC from low-pass $\Delta\Sigma$ ADCs without sub-ADC mismatch calibration and FIG. 15B shows FFT plots that show that time-interleaving spurs are pushed out-of-band after outputs of the two band-pass ADCs are combined according to examples of the present disclosure.
Figure 15B:
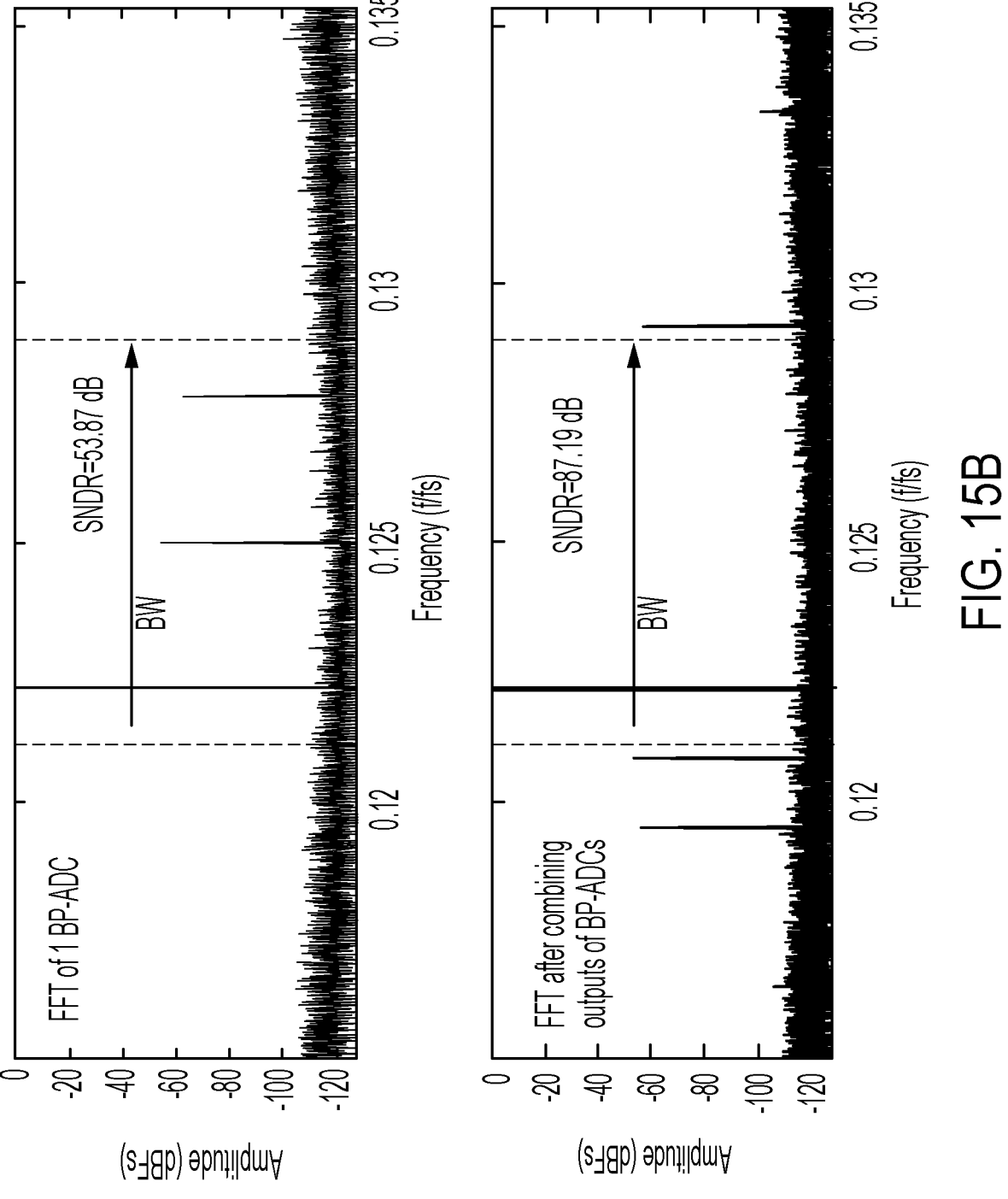

FIG. 15A shows a frequency-time-interleaving technique 1500 to create band-pass ADC from low-pass ΔΣ ADCs without sub-ADC mismatch calibration and FIG. 15B shows FFT plots that show that time-interleaving spurs are pushed out-of-band after outputs of the two band-pass ADCs are combined according to examples of the present disclosure. Band-pass ADCs are an attractive solution for direct digitization at intermediate frequency (IF) which reduces complexity of the receiver chain and can be useful for low energy IoT applications. Band-pass ADCs are conventionally designed using LC or RC based resonators which consume large chip area and power. In a recent work in Sanjeev T. Chandrasekaran, Stefano Pietri, and Arindam Sanyal, "21 fJ/step OTA-Less, Mismatch-Tolerant Continuous-Time VCO-Based Band-Pass ADC", *SSC-L*, vol. 3, pp. 342-345, 2020, a highly digital band-pass ADC without any LC/RC resonator is demonstrated by time-interleaving low-pass, VCO-based ΔΣ ADCs. While this solution is attractive, the band-pass ADC still suffers from the expected gain/timing mismatch issues as in any time-interleaved ADC. A frequency-time-interleaving (FTI) is used to create a band-pass ADC by using only low-pass ΔΣ ADCs. As shown in FIG. 15A, the disclosed technique uses the low-pass ΔΣ ADCs disclosed above and time-interleave them to create a band-pass ADC. Two such band-pass ADCs are operated at slightly different frequencies (Fs+Δf and Fs−Δf) such that difference of the sampling frequencies of the two band-pass ADCs is greater than the desired signal bandwidth $f_B$. The two ADC outputs are then re-sampled to the same sampling frequency (Fs) using a combination of interpolator and decimator and added together to form the overall ADC output.

As shown in prior work in Sanjeev T. Chandrasekaran, Stefano Pietri, and Arindam Sanyal, "21 fJ/step OTA-Less, Mismatch-Tolerant Continuous-Time VCO-Based Band-Pass ADC", *SSC-L*, vol. 3, pp. 342-345, 2020, time-interleaving mismatched low-pass ADCs results in interleaving spurs which appears as images of the original signal. Thus, for an input signal of Fin=Fs+$f_1$, ($f_1$<$f_B$/2<Δf), for the bandpass ADC running at Fs+Δf the interleaving spurs appear at Fs+(2Δf−$f_1$), and for the BP-ADC running at Fs−Δf, the interleaving spurs appear at Fs−(2Δf+$f_1$) which both fall out of the signal band $Fs-f_B/2$ to $Fs-f_B/2$ when the outputs of the two bandpass ADCs are combined and re-sampled. This is shown in the FFT plots in FIG. 15B. For 10% gain error and 10% timing mismatch and 4× time-interleaving, the SNDR of each bandpass ADC is 53.87 dB which is limited by interleaving spurs, but once the outputs of the two bandpass ADCs are combined, the SNDR is improved to 87.19 dB and the interleaving spurs are pushed out-of-band. Thus, the disclosed FTI technique does not need calibration for mismatch between sub-ADCs.

Figure 16:
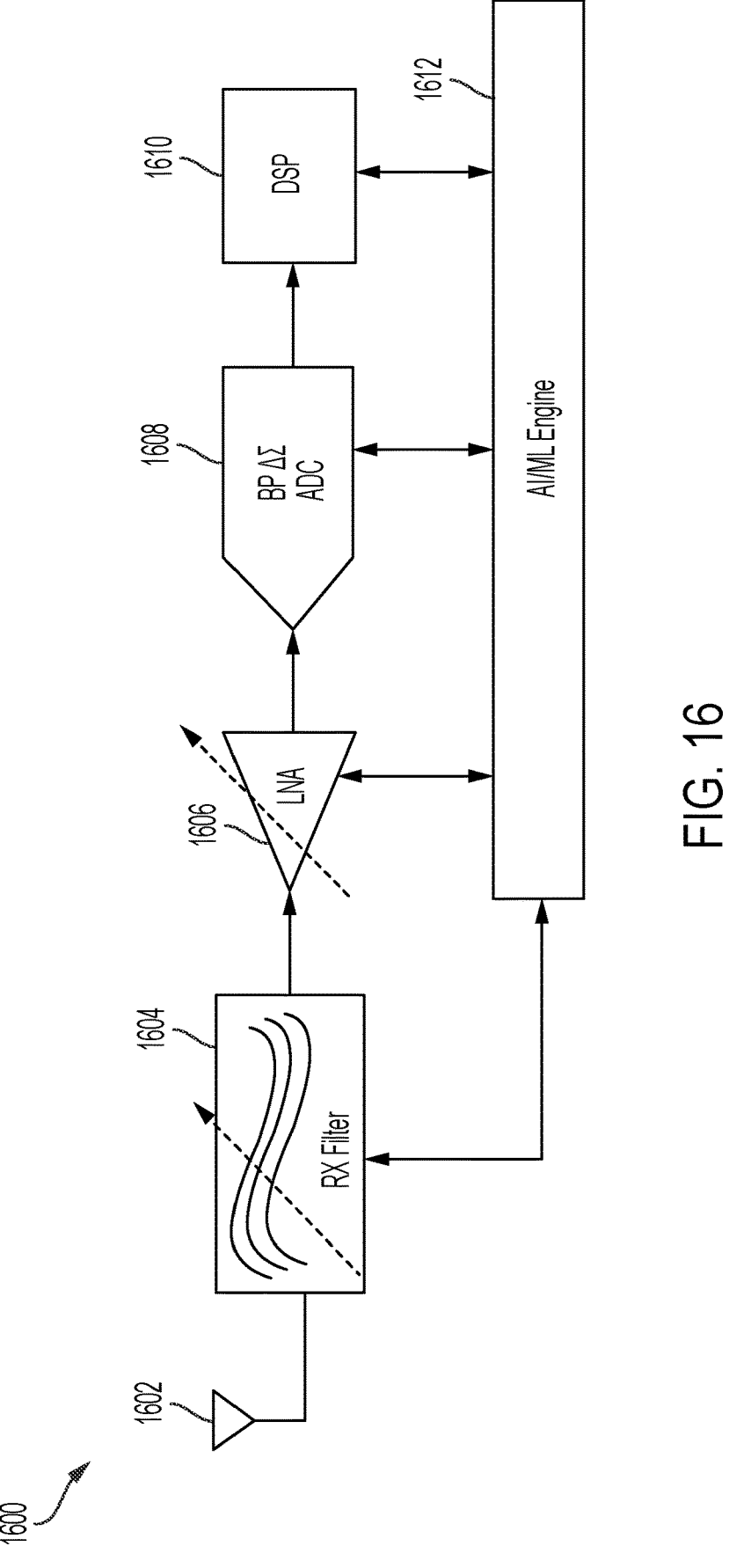
FIG. 16 shows an application of $\Delta\Sigma$ band-pass ADC for cognitive radio with AI managed directed RF digitizer according to examples of the present disclosure.

FIG. 16 shows an application of the disclosed ΔΣ band-pass ADC for cognitive radio with AI managed direct RF digitizer 1600 according to examples of the present disclosure. ΔΣ band-pass ADC for cognitive radio with AI managed direct RF digitizer 1600 comprises antenna 1602, variable receiver filter 1604, low noise amplifier 1606, band-pass ΔΣ ADC 1608, as discussed above, digital signal processor (DSP) 1610, and artificial intelligence (AI)/machine learning (ML) engine 1612. In operation, artificial intelligence (AI)/machine learning (ML) engine 1612 can communicate with one or more of variable receiver filter 1604, low noise amplifier 1606, band-pass ΔΣ ADC 1608, as discussed above, DSP 1610. The disclosed research has the potential to lead to a new class of calibration free, low-pass and band-pass highly digital ΔΣ ADCs that are robust against corner variations. Scalability due to digital nature, ability to operate from low supply voltages and small footprint makes the disclosed solution attractive for deployment in IoT sensor interface. Since the disclosed ADCs are highly digital, their speed can be scaled easily from low bandwidth to high bandwidth spanning a wide range of applications. Beyond IoT, the disclosed ADCs can be extended to bio-medical applications which have similar/lower bandwidth or extended to high-speed receivers/direct RF digitizers by operating at higher supply voltages and trading-off power for speed. In particular, the disclosed band-pass ADC architecture can be tuned easily and thus, can be used in cognitive radios. As shown in FIG. 16, programming the band-pass ADC through AI/ML engine can result in low-power cognitive radio receivers that can digitally re-program the receiver chain to find the best frequency band and improve quality of communication.

Figure 17:
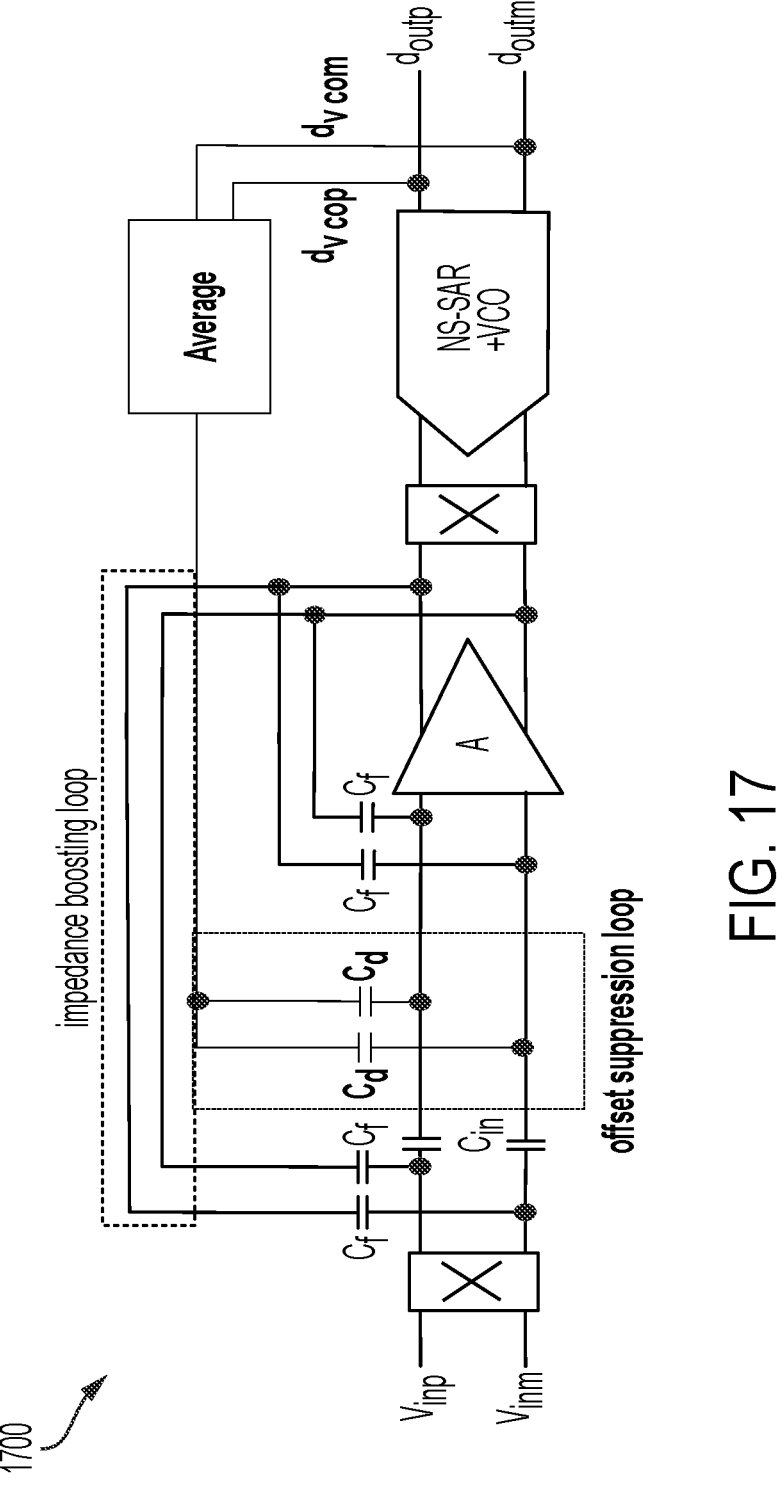
FIG. 17 shows an arrangement for addressing non-idealities in the sensor interface through analog front-end and electrode mismatch and offset correction according to examples of the present disclosure.

FIG. 17 shows an example addressing non-idealities in the sensor interface through analog front-end and electrode mismatch and offset correction 1700 according to examples of the present disclosure. Apart from the ADC optimization, the sensor interface also has several non-idealities, the key being mismatch between the differential inputs and time-varying offset which can saturate the ADC. FIG. 17 shows the schematic of the analog front-end for addressing mismatch and offset in the sensor interface. Mismatch between the differential inputs is modulated by placing the input chopper before $C_{in}$. However, this reduces input impedance of the amplifier which may not be desirable in many applications. To counter this, an impedance boosting loop is added which supplies fraction of the current from the amplifier output to the input to increase the effective input impedance. Since $C_{in}$ no longer blocks the dc offset in the differential inputs, the amplified dc offset can over-range the ADC. This is typically addressed through an analog dc servo loop in Yoo, L. Yan, D. El-Damak, M. A. B. Altaf, A. H. Shoeb, and A. P. Chandrakasan, "An 8-channel scalable EEG acquisition SoC with patient-specific seizure classification and recording processor," JSSC, vol. 48, no. 1, pp. 214-228, January 2013, which requires large area capacitors to realize high-pass transfer function with very low cut-off frequency, and/or use of high gain amplifiers. In contrast, a digital dc servo loop is used in which the differential VCO outputs are averaged to extract the offset which is capacitively applied to the amplifier input for offset suppression. To improve energy efficiency, a floating inverter amplifier architecture is used which has intrinsic high input common-mode rejection and is robust across corners.

As shown in our prior work in Sanjeev T. Chandrasekaran, Stefano Pietri, and Arindam Sanyal, "21 fJ/step OTA-Less, Mismatch-Tolerant Continuous-Time VCO-Based Band-Pass ADC", SSC-L, vol. 3, pp. 342-345, 2020, time-interleaving mismatched low-pass ADCs results in interleaving spurs which appears as images of the original signal. Thus, for an input signal of $Fin=Fs+f_1$, $(f_1<f_B/2<\Delta f)$, for the bandpass ADC running at $Fs+\Delta f$ the interleaving spurs appear at $Fs+(2\Delta f-f_1)$, and for the BP-ADC running at $Fs-\Delta f$, the interleaving spurs appear at $Fs-(2\Delta f+f_1)$ which both fall out of the signal band $Fs-f_B/2$ to $Fs-f_B/2$ when the outputs of the two bandpass ADCs are combined and re-sampled. This is shown in the FFT plots in FIG. 15B. For 10% gain error and 10% timing mismatch and 4× time-interleaving, the SNDR of each bandpass ADC is 53.87 dB which is limited by interleaving spurs, but once the outputs of the two bandpass ADCs are combined, the SNDR is improved to 87.19 dB and the interleaving spurs are pushed out-of-band. Thus, the disclosed FTI technique does not need calibration for mismatch between sub-ADCs.

Simulations show promising results and the potential of a highly digital band-pass ADC without resonators, and without correction/calibration for interleaving errors. The low-pass ΔΣ ADC developed in above will be used as sub-ADC for the disclosed FTI band-pass ADC architecture. The low-pass ΔΣ ADC will be already optimized for energy efficiency as part of research tasks discussed above. The digital re-sampling filters will be optimized for energy efficiency and will use polyphase filter banks for interpolation and decimation with low hardware cost.

This disclosure provides for a pipelined NS-SAR+VCO ADC that significantly relaxes the challenge of driving large sampling capacitance while improving suppression of in-band quantization noise. Thanks to the pipelined architecture, the disclosed ADC achieves the best energy efficiency among high-resolution passive NS-SAR ADCs.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods are illustrated and described may be re-arranged, and/or two or more elements may occur simultaneously. The embodiments were chosen and described in order to best explain the principles of the invention and its practical applications, to thereby enable others skilled in the art to best utilize the invention and various embodiments with various modifications as are suited to the particular use contemplated.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

The various embodiments are described for illustrative purposes only with reference to the Figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A low-pass and band-pass delta-sigma (ΔΣ) analog-to-digital converter (ADC) device for sensor interface, the device comprising:
   a first stage comprising a low-resolution passive integrator-based noise-shaping successive approximation register (SAR) ADC;
   a second stage configured to obtain an output from the first stage and comprising a voltage-controlled oscillator (VCO)-ADC; and
   a calibration stage configured to obtain an output from the second stage and to estimate and track interstage gain across a process-voltage-temperature (PVT),
   wherein the calibration stage comprises a foreground calibration stage that operates only at device start up to receive the output of the first stage and the second stage to extract an initial interstage gain error and corrects the initial interstage gain error and a background calibration stage that corrects continued instances of the interstage gain error that varies with time, voltage, and temperature of the device.

2. The device of claim 1, wherein the low-resolution passive integrator-based noise-shaping SAR ADC is less than 6 bit and wherein the VCO-ADC has a target resolution greater than 14-bits at low supply voltages.

3. The device of claim 2, wherein the low supply voltages are less than 0.5V.

4. The device of claim 1, further comprising an artificial intelligence or machine learning engine that provides low-power cognitive radio receivers that digitally reprogram a receiver chain to find a best frequency band and improve quality of communication.

5. The device of claim 1, wherein the sensor interface comprises an Internet-of-Things sensor interface.

6. A low-pass and band-pass delta-sigma (ΔΣ) analog-to-digital converter (ADC) system, the system comprising:
   a first stage comprising a low-resolution passive integrator-based noise-shaping successive approximation register (SAR) ADC;
   a second stage configured to obtain an output from the first stage and comprising a voltage-controlled oscillator (VCO)-ADC;
   a calibration stage configured to obtain an output from the second stage and to estimate and track interstage gain across a process-voltage-temperature (PVT); and
   an artificial intelligence or a machine learning engine that is programmed to communicate with either the first stage or the second stage,
   wherein the calibration stage comprises a foreground calibration stage that operates only at device start up to receive the output of the first stage and the second stage to extract an initial interstage gain error and corrects the initial interstage gain error and a background calibration stage that corrects continued instances of the interstage gain error that varies with time, voltage, and temperature of the device.

7. The system of claim 6, wherein the artificial intelligence or the machine learning engine is further programmed to provide low-power cognitive radio receivers that digitally reprogram a receiver chain to find a best frequency band and improve quality of communication.

8. The system of claim 6, wherein the low-resolution passive integrator-based noise-shaping SAR ADC is less than 6 bit.

9. The system of claim 6, wherein the VCO-ADC has a target resolution greater than 14-bits at low supply voltages.

10. The system of claim 9, wherein the low supply voltages are less than 0.5V.

11. The system of claim 6, wherein the artificial intelligence or the machine learning engine is further programmed to provide a sensor interface.

12. The system of claim 11, wherein the sensor interface comprises an Internet-of-Things sensor interface.

13. The system of claim 7, wherein the artificial intelligence or the machine learning engine uses frequency-time-interleaving to ensure that no spurious tones are inside signal band of the band-pass ADC and thus the ADC has a high resolution without requiring calibration.

14. A radio comprising:
   band-pass delta-sigma (ΔΣ) analog-to-digital converter (ADC);
   a first stage comprising a low-resolution passive integrator-based noise-shaping successive approximation register (SAR) ADC; and
   a second stage configured to obtain an output from the first stage and comprising a voltage-controlled oscillator (VCO)-ADC; and
   a calibration stage configured to obtain an output from the second stage and to estimate and track interstage gain across a process-voltage-temperature (PVT), wherein the calibration stage comprises a foreground calibration stage that operates only at device start up to receive the output of the first stage and the second stage to extract an initial interstage gain error and corrects the initial interstage gain error and a background calibration stage that corrects continued instances of the interstage gain error that varies with time, voltage, and temperature of the device.

15. The radio of claim 14, wherein the low-resolution passive integrator-based noise-shaping SAR ADC is less than 6 bit.

16. The radio of claim 14, further comprising an artificial intelligence or machine learning engine that provides low-power cognitive radio receivers that digitally reprogram a receiver chain to find a best frequency band and improve quality of communication.

17. The radio of claim 16, wherein the artificial intelligence or the machine learning engine is in communication with a radio frequency filter, a low noise amplifier, and the band-pass $\Delta\Sigma$ ADC.

18. The device of claim 1, wherein a first stage receives an analog input signal and outputs a low-resolution digitized version of the analog input and outputs an integral of a quantization error, wherein the quantization error is the difference between the analog input and the low-resolution digitized version of the analog input and the second receives the integral of the quantization error from the first stage and outputs a digitized version of the integral of the quantization error.

19. The device of claim 1, further comprising a third stage that combines outputs of the first stage and the second stage with a calibrated interstage gain determined by the calibration stage to produce a high-resolution digitized version of the analog input.

* * * * *